(12) United States Patent
Fichter et al.

(10) Patent No.: US 10,546,717 B2
(45) Date of Patent: *Jan. 28, 2020

(54) HIGH-VOLTAGE SUPPLY UNIT AND CIRCUIT ARRANGEMENT FOR GENERATING A HIGH VOLTAGE FOR A PARTICLE BEAM APPARATUS

(71) Applicant: Carl Zeiss Microscopy GmbH, Jena (DE)

(72) Inventors: Edgar Fichter, Unterkochen (DE); Joerg Fober, Heuchlingen (DE); Dirk Preikszas, Oberkochen (DE); Christian Hendrich, Westhausen (DE); Michael Schnell, Rechberghausen (DE); Momme Mommsen, Oberkochen (DE)

(73) Assignee: Carl Zeiss Microscopy GmbH, Jena (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/924,836

(22) Filed: Mar. 19, 2018

(65) Prior Publication Data

US 2018/0211815 A1 Jul. 26, 2018

Related U.S. Application Data

(62) Division of application No. 15/135,841, filed on Apr. 22, 2016, now Pat. No. 9,953,804.

(30) Foreign Application Priority Data

Apr. 23, 2015 (DE) .................. 10 2015 207 484

(51) Int. Cl.
  *H01J 37/28* (2006.01)
  *H01J 37/24* (2006.01)

(52) U.S. Cl.
  CPC ............ *H01J 37/241* (2013.01); *H01J 37/28* (2013.01); *H01J 2237/002* (2013.01)

(58) Field of Classification Search
  USPC .......................................................... 250/306
  See application file for complete search history.

(56) References Cited

U.S. PATENT DOCUMENTS

| 5,760,571 | A  | * | 6/1998 | Latham, II | G05F 1/613 |
| | | | | | 323/274 |
| 7,554,072 | B2 | * | 6/2009 | Schmidt | H03F 3/08 |
| | | | | | 250/214 A |
| 8,497,476 | B2 | * | 7/2013 | Hatakeyama | G01N 23/2251 |
| | | | | | 250/310 |
| 9,362,813 | B2 | * | 6/2016 | Hu | H02M 1/00 |
| 9,389,624 | B2 | * | 7/2016 | Handford | G05F 1/468 |
| 9,953,804 | B2 | * | 4/2018 | Fichter | H01J 37/241 |

* cited by examiner

*Primary Examiner* — Phillip A Johnston
(74) *Attorney, Agent, or Firm* — Muirhead and Saturnelli, LLC

(57) ABSTRACT

The system described herein relates to a high-voltage supply unit for providing an output voltage for a particle beam apparatus, wherein the particle beam apparatus is embodied as, for example, an electron beam apparatus and/or an ion beam apparatus. The system described herein is based on the fact that it was recognized that a bipolar voltage supply unit can be formed by means of a unipolar first current source and a unipolar second current source, said bipolar voltage supply unit enabling a load current in two directions. The high-voltage supply unit according to the system described herein can be operated in the 4-quadrant operation. In the 4-quadrant operation, a first voltage source for supplying the first current source and a second voltage source for supplying the second current source are embodied as different voltage sources.

19 Claims, 12 Drawing Sheets

US 10,546,717 B2

HIGH-VOLTAGE SUPPLY UNIT AND CIRCUIT ARRANGEMENT FOR GENERATING A HIGH VOLTAGE FOR A PARTICLE BEAM APPARATUS

TECHNICAL FIELD

The system described herein relates to a high-voltage supply unit for providing an output voltage for a particle beam apparatus such as an electron beam apparatus and/or an ion beam apparatus and more particularly to a circuit arrangement for generating a high voltage for a particle beam apparatus and a resistor circuit arrangement for the aforementioned high-voltage supply unit.

BACKGROUND OF THE INVENTION

Electron beam apparatuses, in particular a scanning electron microscope (also referred to as SEM below) and/or a transmission electron microscope (also referred to as TEM below), are used to examine objects (also referred to as samples) in order to obtain knowledge in respect of the properties and behavior of the objects under certain conditions.

In an SEM, an electron beam (also referred to as primary electron beam below) is generated by means of a beam generator and focused on an object to be examined by way of the beam guiding system. An objective lens is used for focusing purposes. The primary electron beam is guided in a grid-shaped manner over the surface of the object to be examined by way of a deflection device. Here, the electrons of the primary electron beam interact with the object to be examined. Interaction particles and/or interaction radiation is/are generated as a result of the interaction. By way of example, the interaction particles are electrons. In particular, electrons are emitted by the object—the so-called secondary electrons—and electrons of the primary electron beam are scattered back—the so-called backscattered electrons. The secondary electrons and backscattered electrons are detected by means of at least one particle detector. The particle detector generates detection signals, which are used to generate an image of the object. Thus, an image of the object to be examined is obtained. By way of example, the interaction radiation comprises x-ray radiation and/or cathodoluminescence radiation. The interaction radiation is detected by means of at least one radiation detector, which generates detection signals. By way of example, these detection signals are used to generate spectra, by means of which properties of the object to be examined are determined.

In a TEM, a primary electron beam is likewise generated by means of a beam generator and focused on an object to be examined by means of a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system having an objective. By way of example, the aforementioned system additionally also comprises a projection lens. Here, imaging can also take place in the scanning mode of a TEM. Such a TEM is generally referred to as STEM. Additionally, provision can be made for detecting electrons scattered back at the object to be examined and/or secondary electrons emitted by the object to be examined by means of a further detector in order to image an object to be examined.

The integration of the function of an STEM and an SEM in a single particle beam apparatus is known. It is therefore possible to carry out examinations of objects with an SEM function and/or with an STEM function using this particle beam apparatus.

Furthermore, the prior art has disclosed the practice of analyzing and/or processing an object in a particle beam apparatus using, firstly, electrons and, secondly, ions. By way of example, an electron beam column having the function of an SEM is arranged at the particle beam apparatus. Additionally, an ion beam column is arranged at the particle beam apparatus. Ions used for processing an object are generated by means of an ion beam generator arranged in the ion beam column. By way of example, material of the object is ablated or material is applied onto the object during the processing. The ions are additionally or alternatively used for imaging. The electron beam column with the SEM function serves, in particular, for further examination of the processed or unprocessed object, but also for processing the object.

In the above-described particle beam apparatuses, provision is made of accelerating the charged particles of the particle beam to a certain energy. More precisely, provision is made of accelerating the electrons of the primary electron beam and/or the ions of the ion beam to a certain energy. This is explained below on the basis of electrons of a primary electron beam. An analogous statement applies to ions of an ion beam.

Electrons are generated by means of a beam generator both in an SEM and in a TEM. The electrons emerge from the beam generator and form the primary electron beam. The electrons are accelerated to a potential due to a potential difference between the beam generator and an anode. To this end, the beam generator is usually supplied with negative high voltage. By way of example, in the case of an SEM, this lies in the region of 0 V to (−50) kV in relation to the ground potential. By way of example, in the case of a TEM, the high voltage lies in the region of (−5) kV to (−4) MV in relation to the ground potential. In order to obtain a desired maximum resolution or a desired contrast and/or in order to adjust to a desired object thickness passable by radiation and/or a limit to the damage of the object, the practice of setting the high voltage to a certain value is known. In order, furthermore, to obtain a good resolution in the final images provided by the particle beam apparatuses, it is desirable to keep the voltage applied to the beam generator as stable as possible. Expressed differently, it is desirable for the high voltage provided by a high-voltage supply unit not to be subject to variations which would restrict a good resolution in the final images.

The prior art has disclosed a high-voltage supply unit for a particle beam apparatus, which has an AC voltage source which is adjusted by an amplitude regulator by way of a desired setpoint value of the high voltage and the output voltage of which is supplied to a step-up transformer. The step-up transformer steps up the AC voltage. The output voltage of the step-up transformer is fed to a Cockcroft-Walton generator in turn, the latter multiplying the output voltage of the step-up transformer. The high voltage arising thus is smoothed by way of a filter member or a plurality of filter members made of resistors and capacitors. The high voltage smoothed thus is fed to the amplitude regulator via a measurement resistor. Variations in the smoothed high voltage can be registered by way of a capacitive divider consisting of a first capacitor and a second capacitor, and said variations can be fed to an amplifier. The amplifier can provide an output signal which is fed to the amplitude regulator and which acts in anti-phase in relation to the variations of the smoothed high voltage. The variations of the smoothed high voltage can be additionally damped in this manner.

The high-voltage supply units used in the particle beam apparatuses are disadvantageous in that they only enable a 1-quadrant operation. This means that the known high-voltage supply units can only provide voltage values which are assignable to a single quadrant. Then, this is also referred to as a unipolar voltage supply unit, which only enables a load current in one direction. This is explained in greater detail with reference to FIG. 1. FIG. 1 shows a schematic illustration of a current-voltage behavior, in which the current is plotted on the abscissa axis and the voltage is plotted on the ordinate axis. The abscissa axis and the ordinate axis intersect at an origin. The origin separates negative current values ($I_-$) from positive current values ($I_+$). Moreover, the origin separates negative voltage values ($U_-$) from positive voltage values ($U_+$). The abscissa axis and the ordinate axis separate 4 quadrants from one another, namely a first quadrant I, a second quadrant II, a third quadrant III, and a fourth quadrant IV. In the case of the unipolar voltage supply unit, only voltage values which are assignable to a single one of the aforementioned quadrants are provided. However, a 4-quadrant operation is desirable such that it is possible to provide voltage values in all four quadrants (cf. FIG. 1). The rectangle depicted in FIG. 1 is delimited by a maximumly obtainable positive voltage $U_{+max}$, a maximumly obtainable negative voltage $U_{-max}$, a maximumly obtainable positive current $I_{+max}$, and a maximumly obtainable negative current $I_{-max}$. The work range of a desired bipolar voltage supply unit should lie within the depicted rectangle. Accordingly, a bipolar voltage supply unit enabling a load current in two directions is desired. In the case of further application forms, it is desirable to provide at least a 2-quadrant operation, by means of which a unipolar voltage supply unit can be formed.

Accordingly, it is desirable to provide a high-voltage supply unit and a circuit arrangement for generating a high voltage for a particle beam apparatus and a particle beam apparatus with a high-voltage supply unit, which enable a 4-quadrant operation or a 2-quadrant operation.

SUMMARY OF THE INVENTION

The high-voltage supply unit according to the system described herein provides an output voltage for a particle beam apparatus. By way of example, the output voltage is a DC voltage in the range from (−300) kV to 300 kV. However, the invention is not restricted to the aforementioned region. Rather, the invention relates to any suitable range of an output voltage.

The high-voltage supply unit according to the system described herein has at least one first current source for providing a first current. Furthermore, it has at least one voltage source connected to the first current source by way of a first line. The first voltage source provides an operating voltage for the first current source. The high-voltage supply unit furthermore has at least one second current source for providing a second current, wherein the second current source is linked to the first current source by way of a second line. For the purposes of supplying the second current source with an operating voltage, at least one second voltage source is linked to the second current source by way of a third line. In one embodiment of the system described herein, the first voltage source and the second voltage source are embodied as different voltage sources. In a further embodiment of the system described herein, the first voltage source and the second voltage source are embodied as a single voltage source. In other words, the single voltage source in this exemplary embodiment forms both the first voltage source and the second voltage source. Moreover, the high-voltage supply unit according to the system described herein has at least one adjustment and/or control loop for adjusting and/or regulating the output voltage. The output voltage is a high voltage which is provided to at least one high-voltage component of the particle beam apparatus. Expressed in other words, the output voltage is applied to at least one high-voltage component of the particle beam apparatus.

The high-voltage supply unit according to the system described herein also has an optical and/or electronic coupling device, which links the adjustment and/or control loop with the first current source and/or the second current source. By means of the coupling device, it is possible in one embodiment of the system described herein to adjust and/or regulate the first current source and/or the second current source by way of signals from the adjustment and/or control loop. In particular, provision is accordingly made for the second current in the aforementioned embodiment to be adjusted and/or regulated by means of the signals from the adjustment and/or control loop.

Furthermore, at least one feedback resistor is provided in the high-voltage supply unit according to the system described herein. The feedback resistor is linked to the adjustment and/or control loop, the first current source, and the second current source by way of lines. More precisely, the feedback resistor is linked to the adjustment and/or control loop by way of a fourth line. Furthermore, the feedback resistor is linked to the first current source by way of a fifth line. Moreover, the feedback resistor is linked to the second current source by way of a sixth line. A third current flows through the feedback resistor. The feedback resistor, the first current source, and the second current source moreover are linked to a high-voltage connector by way of a seventh line, through which a fourth current flows. At least two of the aforementioned lines can be identical or at least partly identical.

The system described herein is based on the fact that it was recognized that a bipolar voltage supply unit can be embodied by means of a unipolar first current source and a unipolar second current source, said bipolar voltage supply unit enabling a load current in two directions. Expressed differently, the high-voltage supply unit according to the system described herein can be operated in the 4-quadrant operation. In the 4 quadrant operation, the first voltage source and the second voltage source are embodied as different voltage sources. If the first voltage source and the second voltage source are embodied as an individual voltage source, a unipolar voltage supply unit enabling a 2-quadrant operation is provided.

By way of example, the first current source serves to predetermine a maximum positive current $I_{+max}$ which is intended to be obtained in the first quadrant I and the fourth quadrant IV (cf. FIG. 1). By way of example, the second current source, which is switched in series with the first current source, ensures the 4-quadrant operation of the high-voltage supply unit according to the system described herein. The second current source determines the maximum negative current $I_{-max}$ in terms of absolute value in the second quadrant II and the third quadrant III (cf. FIG. 1). In particular, provision is made in the system described herein for correcting by way of the adjustment and/or control loop the output voltage via the third current flowing in the feedback resistor. Then, the second current is adjusted and regulated by means of the adjustment and/or control loop in such a way that, for example, the following applies:

$$I_2 = I_1 - I_3 - I_4$$

where is the first current, $I_2$ is the second current, $I_3$ is the third current, and $I_4$ is the fourth current.

In one embodiment of the high-voltage supply unit according to the system described herein, provision is additionally or alternatively made for the first current source to be embodied as an adjustable current source and for the second current source to be embodied as a constant current source. The adjustment and/or control loop then acts on the first current source in such a way that the first current is adjustable. As an alternative thereto, provision is made for the first current source to be embodied as a constant current source and for the second current source to be embodied as an adjustable current source. In a further alternative thereto, provision is made for both the first current source and the second current source to be respectively embodied as an adjustable current source. The adjustment and/or the control loop then acts both on the first current source and the second current source in such a way that both the first current and the second current are adjustable. As a result, there is a reduction in the power losses in both the two current sources and the high-voltage supply unit in the case of the same maximum output current $I_{max}$.

In yet another embodiment of the high-voltage supply unit according to the system described herein, provision is additionally or alternatively made for the feedback resistor to be embodied as a resistance sequence. By way of example, provision is made for the feedback resistor to have n resistors, wherein n is an integer and the n resistors are switched in series. By way of example, n is an integer in the range from 2 to 800, for example in the range from 200 to 600 or, for example, in the range from 300 to 500. By way of example, n is 400 in one exemplary embodiment. In particular, provision is made for the n resistors to have an identical embodiment and have an identical resistance in each case.

In a further exemplary embodiment, provision is made for the feedback resistor to additionally have a holder, for example a printed circuit board or free wiring, at which the n resistors are arranged. Moreover, the feedback resistor has a cooling unit. The cooling unit is thermally coupled to the n resistors. Expressed differently, there is a temperature flow between the n resistors and the cooling unit. In particular, provision is made for the cooling unit to have an identical thermal resistance to each one of the n resistors. In a further embodiment of the high-voltage supply unit according to the system described herein, provision is additionally or alternatively made for at least one thermally conductive insulation to be arranged between the holder and the cooling unit. The thermally conductive insulation is not electrically conductive and it is therefore referred to as insulation. However, it is thermally conductive. By way of example, the thermally conductive insulation is embodied as an encapsulation, in particular in the form of a mass made of epoxy resin or polyurethane, or in the form of an insulation liquid. In addition or as an alternative thereto, the thermally conductive insulation can also be made of silicone. Furthermore, provision is additionally or alternatively made for the cooling unit to be arranged at the thermally conductive insulation in such a way that the cooling unit contacts the thermally conductive insulation. By way of example, provision is also made for the thermally conductive insulation to contact each one of the n resistors. All of the aforementioned exemplary embodiments ensure that the n resistors have a substantially identical thermal resistance to the cooling unit. Accordingly, the same temperature difference sets-in between the n resistors and the cooling unit for all n resistors. The temperature coefficient of resistors (i.e. the dependence of the resistance value on the temperature) is scattered in a statistical manner about a mean temperature coefficient. In the case of precision resistors, this scattering of the temperature coefficients can be very small, in particular small in relation to the mean temperature coefficient. As a result of the above-described same temperature in the n resistors, there is an avoidance of a change or drift of a resistor-divider ratio of the resistance sequence on account of the mean temperature coefficient and a change in the common temperature of the n resistors. The output voltage therefore remains more stable and is hardly subject to measurable variations or drifts.

In a further embodiment of the system described herein, provision is additionally or alternatively made for the voltage coefficients of the n resistors to be substantially identical. The voltage coefficient of a resistor describes the dependence of the resistor on an applied voltage. As already mentioned above, provision is additionally or alternatively made for each one of the n resistors to have an identical embodiment. As will still be explained in more detail below, a partial voltage of the feedback resistor then is independent of the voltage coefficients of the n resistors. Thus, in principle, the feedback resistor is a voltage divider which exhibits linear behavior up to the maximum voltage of a partial resistor (i.e. one of the n resistors) multiplied by the number of n resistors. If the maximum voltage of a partial resistor is 100 V and the number of resistors is 400, then linearity is given in a voltage range up to 40 kV. Reference is explicitly made to the fact that the aforementioned number example should only be understood to be exemplary and not restrictive.

In one embodiment of the high-voltage supply unit according to the system described herein, provision is additionally or alternatively made for the first current source and the second current source to be switched in series. In addition or as an alternative thereto, the output voltage of the high-voltage supply unit according to the system described herein is bipolar.

In a further embodiment of the high-voltage supply unit according to the system described herein, provision is additionally or alternatively made for the high-voltage supply unit to have at least one feedback unit with at least one capacitive voltage divider, wherein the feedback unit is linked to the feedback resistor. By way of example, provision is made for the feedback unit to be switched in parallel with the feedback resistor. As a result of this, it is possible to measure a change in the output voltage more quickly and therefore determine the third current flowing through the feedback resistor more quickly. As a result of this, it is possible, for example, to adjust and/or regulate the second current of the second current source more quickly by way of the adjustment and/or control loop. Furthermore, the feedback unit allows a reduction in the residual ripple and noise in the output voltage due to a higher sensitivity when determining the third current. The term residual ripple is explained below. By way of example, the DC voltage is generated by rectifying an AC voltage. A voltage which is a superposition of a DC voltage and an AC voltage often arises in the process. In order to suppress the AC voltage to the greatest possible extent, use is made of e.g. smoothing capacitors which substantially smooth the voltage, i.e. reduce the portion of the AC voltage. The portion of the AC voltage in the voltage after smoothing is referred to as residual ripple. It can be reduced by way of the present embodiment.

In a further embodiment, provision is made for the capacitive voltage divider to have a first capacitor and a second capacitor, wherein the second capacitor has a capacitance of zero. This then corresponds to a divider ratio of 1. This is explained in more detail below.

The system described herein also relates to a circuit arrangement for generating a high voltage for a particle beam apparatus. The circuit arrangement according to the system described herein has at least one high-voltage supply unit for providing an output voltage. The high-voltage supply unit can have any design. In one embodiment, the high-voltage supply unit is, for example, a high-voltage supply unit with at least one of the features specified further above or yet to be specified below or with a combination of at least two of the features specified further above or yet to be specified below. In an alternative embodiment, the high-voltage supply unit is embodied as a high-voltage supply unit in 1-quadrant operation or in 2-quadrant operation.

Moreover, the circuit arrangement according to the system described herein has at least one noise suppression unit, which is linked to the high-voltage supply unit by way of at least one link line for the purposes of guiding the output voltage from the high-voltage supply unit into the noise suppression unit. The noise suppression unit comprises at least one noise measurement device for registering noise of the output voltage and at least one amplifier-filter unit, wherein the amplifier-filter unit is linked to the noise measurement device by way of an eighth line. Moreover, the noise suppression unit comprises at least one control loop (referred to as noise control loop below), wherein the noise control loop is linked to the amplifier-filter unit by a ninth line and wherein the noise control loop is linked to the noise measurement device by way of a tenth line. Moreover, the noise suppression unit comprises at least one high-voltage connector, at which the high voltage is present, wherein the high-voltage connector is linked to the noise control loop by way of an eleventh line.

The aforementioned circuit arrangement is based on the discovery that an improvement in the noise of the high-voltage supply unit can be achieved by virtue of there being a suppression of the noise of the high-voltage supply unit at the output connector of the high-voltage supply unit. Expressed differently, the noise suppression is carried out using the output voltage—i.e. the high voltage—which is detected and suppressed by means of a measurement and control loop. The circuit arrangement according to the system described herein with the noise suppression unit is advantageous in that the noise suppression is not carried out in the high-voltage supply unit and in the adjustment and/or control loop thereof, but, in principle, acts directly on the output voltage of the high-voltage supply unit, for example added to the output voltage. It was found that the noise suppression then is particularly simple and effective.

In an embodiment of the circuit arrangement according to the system described herein, provision is additionally or alternatively made for the noise measuring device to comprise a voltage divider. By way of example, the voltage divider is embodied as a capacitive voltage divider. In one exemplary embodiment, one of the capacitors of the capacitive voltage divider can also have a capacitance of zero. This then corresponds to a divider ratio of 1. This is explained in more detail below.

The system described herein also relates to a resistor circuit arrangement for a high-voltage supply unit of a particle beam apparatus. By way of example, the high-voltage supply unit is a high-voltage supply unit with at least one of the features specified further above or yet to be specified below or with a combination of at least two of the features specified further above or yet to be specified below. The resistor circuit arrangement according to the system described herein has n resistors, wherein n is an integer and the n resistors are switched in series. By way of example, n is an integer in the range from 2 to 800, for example in the range from 200 to 600 or, for example, in the range from 300 to 500. By way of example, n is 400 in one exemplary embodiment. In particular, provision is made for the n resistors to have an identical embodiment and have an identical resistance in each case.

Furthermore, the resistance circuit arrangement according to the system described herein has a holder, for example in the form of a printed circuit board or in the form of free wiring, at which the n resistors are arranged. Moreover, the resistor circuit arrangement according to the system described herein has a cooling unit. The cooling unit is thermally coupled to the n resistors. Expressed differently, there is a temperature flow between the n resistors and the cooling unit. In particular, provision is made for the cooling unit to have an identical thermal resistance to each one of the n resistors. In a further embodiment of the resistor circuit arrangement according to the system described herein, provision is additionally or alternatively made for at least one thermally conductive insulation to be arranged between the holder and the cooling unit. The thermally conductive insulation is not electrically conductive and it is therefore referred to as insulation. However, it is thermally conductive. By way of example, the thermally conductive insulation is embodied as an encapsulation, in particular in the form of a mass made of epoxy resin or polyurethane, or in the form of an insulation liquid. In addition or as an alternative thereto, the thermally conductive insulation can also be made of silicone. Furthermore, provision is additionally or alternatively made for the cooling unit to be arranged at the thermally conductive insulation in such a way that the cooling unit contacts the thermally conductive insulation. By way of example, provision is also made for the thermally conductive insulation to contact each one of the n resistors. All of the aforementioned exemplary embodiments ensure that the n resistors have a substantially identical thermal resistance to the cooling unit. Accordingly, the same temperature difference sets-in between the n resistors and the cooling unit for all n resistors. As a result of this, there is avoidance of a change or drift of the resistor divider ratio due to the mean temperature coefficients and a change in the common temperature of the n resistors.

In a further embodiment, provision is additionally or alternatively made for the voltage coefficients of the n resistors to be substantially identical. The voltage coefficient of a resistor describes the dependence of the resistor on an applied voltage. In this exemplary embodiment, provision is additionally or alternatively made for each one of the n resistors to have an identical embodiment and, in particular, to have an identical resistance. As will still be explained in more detail below, a partial voltage of the series connection of the n resistors then is independent of the voltage coefficients of the n resistors. Thus, in principle, the series connection is a voltage divider which exhibits linear behavior up to the maximum voltage of a partial resistor multiplied by the number n of resistors. In this respect, reference is made to the explanations already provided above, which also apply in this case.

The system described herein also relates to a particle beam apparatus for analyzing and/or processing an object. The particle beam apparatus has at least one beam generator for generating a particle beam with charged particles and at least one objective lens for focusing the particle beam onto the object. By way of example, electrons or ions are provided as charged particles. Moreover, the particle beam apparatus according to the system described herein is provided with at least one detector for detecting interaction particles and/or interaction radiation, wherein the interaction particles and/or the interaction radiation arise/arises due to an interaction of the particle beam with the object. By way of example, the interaction particles are electrons. In particular, electrons are emitted by the object (the so-called secondary electrons). The electrons of the primary electron beam, which are scattered at the object, are, for example, also detected. In particular, provision is made for detecting electrons of the primary electron beam which are scattered back at the object (the so-called backscattered electrons). By way of example, cathodoluminescence light or x-rays are detected as interaction radiation.

Moreover, the particle beam apparatus according to the system described herein has at least one high-voltage component, at which a high voltage is present. Any component of a particle beam apparatus, at which high voltage is present or to which high voltage can be applied, is understood to be a high-voltage component. By way of example, this is/these are the beam generator of the particle beam apparatus and/or an electrode of the particle beam apparatus. Moreover, the particle beam apparatus according to the system described herein has a high-voltage supply unit with at least one of the features specified further above or yet to be specified below or with a combination of at least two of the features specified further above or yet to be specified below. In addition or as an alternative thereto, the particle beam apparatus according to the system described herein has a circuit arrangement with at least one of the features specified further above or yet to be specified below or with a combination of at least two of the features specified further above or yet to be specified below. Once again in addition or as an alternative thereto, the particle beam apparatus according to the system described herein has a resistor circuit arrangement with at least one of the features specified further above or yet to be specified below or with a combination of at least two of the features specified further above or yet to be specified below.

In particular, provision is made for the particle beam apparatus according to the system described herein to be embodied as an electron beam apparatus and/or ion beam apparatus. By way of example, the electron beam apparatus is embodied as an electron beam apparatus with correction elements for correcting image aberrations, for example chromatic and/or spherical aberrations.

BRIEF DESCRIPTION OF THE DRAWINGS

Further practical embodiments and advantages of the system described herein are described below in conjunction with the drawings.

DETAILED DESCRIPTION OF VARIOUS EMBODIMENTS

The system described herein is now explained in more detail by means of particle beam apparatuses in the form of an SEM and in the form of a combination apparatus, which has an electron beam column and an ion beam column. Reference is explicitly made to the fact that the system described herein can be used in any particle beam apparatus, in particular in any electron beam apparatus and/or in any ion beam apparatus.

Figure 1:
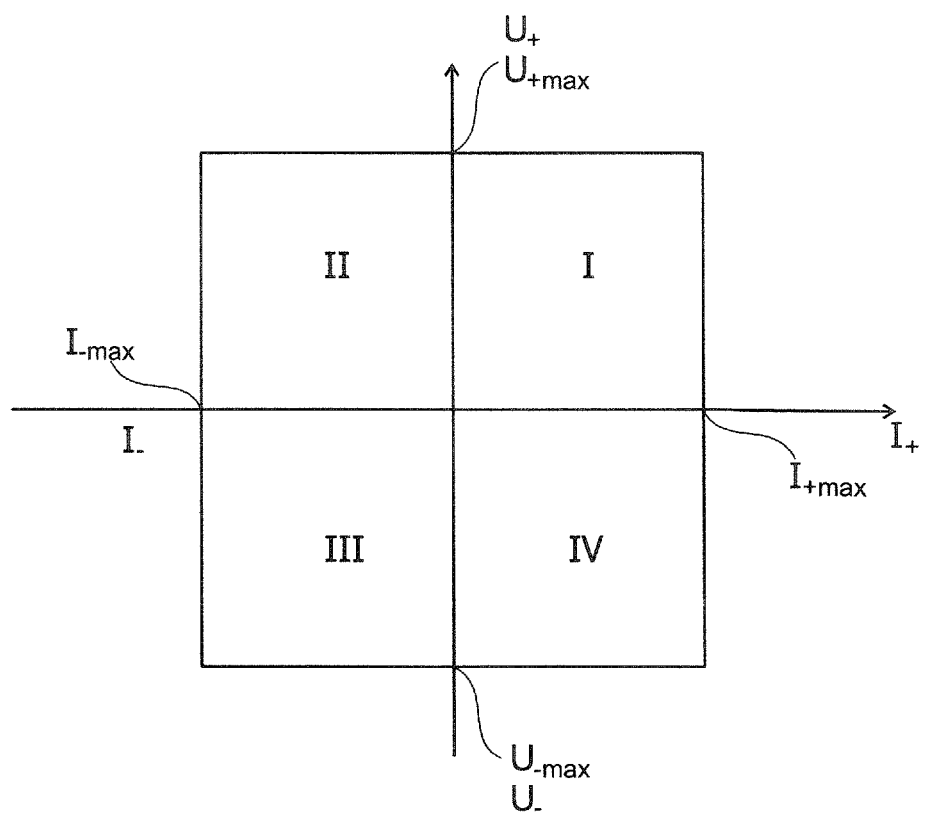
FIG. 1 shows a schematic illustration of a current-voltage ratio of a voltage supply unit.
Figure 2:
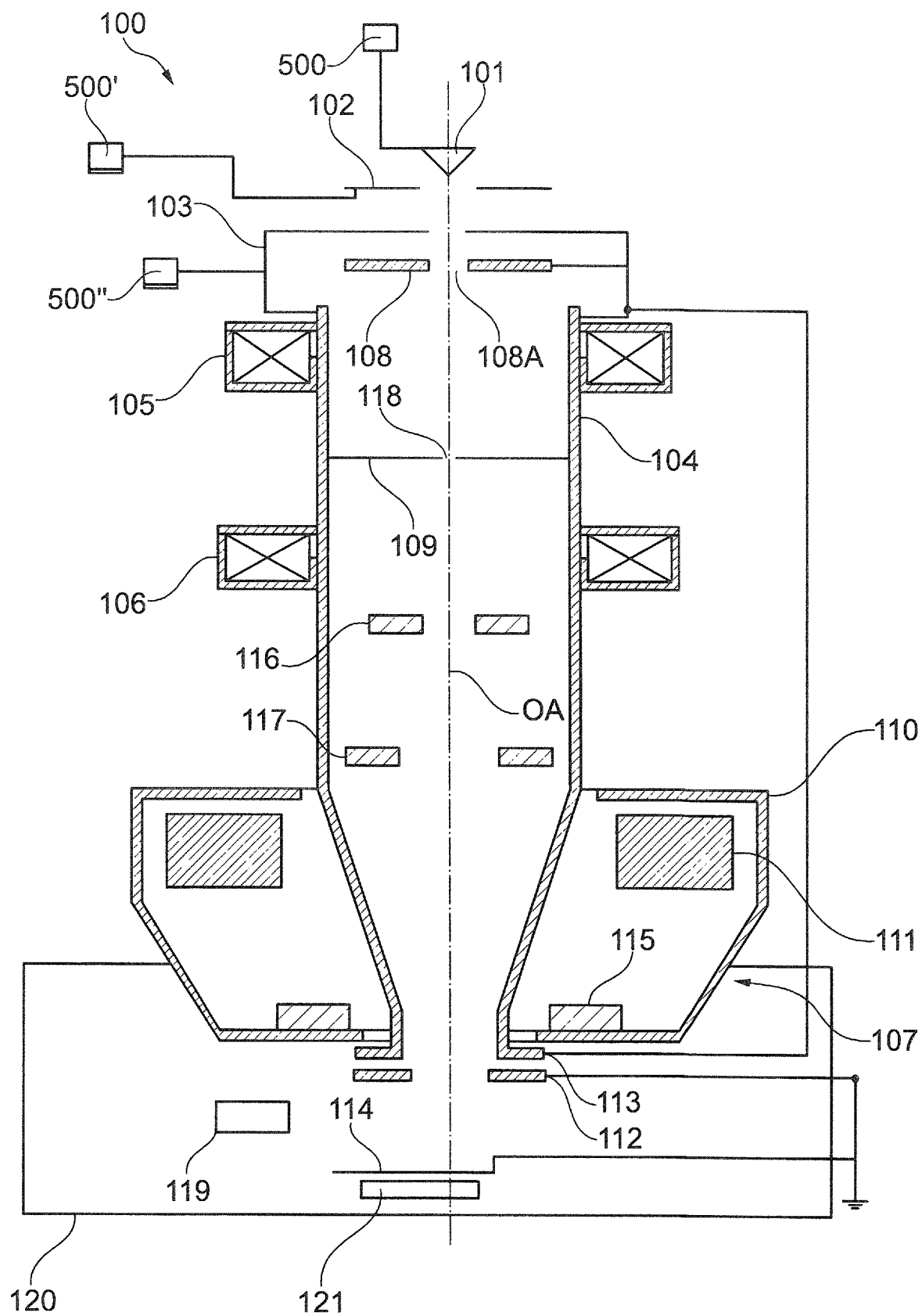
FIG. 2 shows a schematic illustration of a particle beam apparatus in the form of an SEM according to the system described herein.

FIG. 2 shows a schematic illustration of an SEM 100. The SEM 100 has a first beam generator in the form of an electron source 101, which is embodied as a cathode. Furthermore, the SEM 100 is provided with an extraction electrode 102 and with an anode 103, which is placed onto one end of a beam guiding tube 104 of the SEM 100. By way of example, the electron source 101 is embodied as thermal field emitter. However, the invention is not restricted to such an electron source 101. Rather, any electron source is utilizable.

The electron source 101 is at a high voltage potential. Electrons emerging from the electron source 101 form a primary electron beam. The electrons are accelerated to the anode potential due to a potential difference between the electron source 101 and the anode 103. In the exemplary embodiment depicted here, the anode potential is −5 kV to 20 kV, e.g. 5 kV to 15 kV, in particular 8 kV, in relation to a ground potential of the housing of a sample chamber 120. However, alternatively it could be at ground potential.

Two condenser lenses, namely a first condenser lens 105 and a second condenser lens 106, are arranged at the beam guiding tube 104. Here, proceeding from the electron source 101 in the direction of a first objective lens 107, the first condenser lens 105 is arranged first, followed by the second condenser lens 106. Reference is explicitly made to the fact that further embodiments of the SEM 100 may have only a single condenser lens. A first aperture unit 108 is arranged between the anode 103 and the first condenser lens 105. Together with the anode 103 and the beam guiding tube 104, the first aperture unit 108 is at a high voltage potential, namely the potential of the anode 103 or connected to ground. The first aperture unit 108 has a plurality of first apertures 108A, of which one is depicted in FIG. 2. Each one of the plurality of first apertures 108A has a different aperture diameter. By means of an adjustment mechanism (not depicted here), it is possible to set a desired first aperture 108A onto an optical axis OA of the SEM 100. Reference is explicitly made to the fact that the first aperture unit 108 alternatively can also have only a single first aperture 108A. In this case, an adjustment mechanism cannot be provided. In this case, the first aperture unit 108 is stationary. A stationary second aperture unit 109 is arranged between the first condenser lens 105 and the second condenser lens 106. In an alternative exemplary embodiment, the second aperture unit 109 has a displaceable embodiment.

The first objective lens 107 has pole pieces 110, in which a bore is formed. The beam guiding tube 104 is guided through this bore. Furthermore, coils 111 are arranged in the pole pieces 110. This will still be discussed in more detail below.

An electrostatic retardation device is arranged in a lower region of the beam guiding tube 104. It has a single electrode 112 and a tube electrode 113. The tube electrode 113 is arranged at one end of the beam guiding tube 104, which faces an object 114. Together with the beam guiding tube 104, the tube electrode 113 is at the potential of the anode 103, while the single electrode 112 and the object 114 are at a lower potential in relation to the potential of the anode 103. In the present case, this is the ground potential of the housing of the sample chamber 120. In this manner, the electrons of the primary electron beam can be decelerated to a desired energy which is required for examining the object 114. However, the object 114 and the single electrode 112 can also be at different potentials and at potentials different from ground. As a result of this, it is possible, firstly, to displace the location of the retardation of the primary electrons; secondly, it is possible to influence the trajectories of the secondary electrons and the backscattered electrons, which will still be discussed below.

The SEM 100 furthermore has a scanning device 115, by means of which the primary electron beam can be deflected and scanned over the object 114. Here, the electrons of the primary electron beam interact with the object 114. As a result of the interaction, interaction particles and/or interaction radiation is/are generated, which is/are detected. In particular, electrons are emitted from the surface of the object 114—the so-called secondary electrons—or electrons of the primary electron beam are scattered back—the so-called backscattered electrons—as interaction particles.

A detector arrangement comprising a first detector 116 and a second detector 117 is arranged in the beam guiding tube 104 for detecting the secondary electrons and/or the backscattered electrons. Here, the first detector 116 is arranged on the source-side along the optical axis OA, while the second detector 117 is arranged on the object-side along the optical axis OA in the beam guiding tube 104. The first detector 116 and the second detector 117 are arranged offset from one another in the direction of the optical axis OA of the SEM 100. Both the first detector 116 and the second detector 117 each have a passage opening, through which the primary electron beam can pass. The first detector 116 and the second detector 117 are approximately at the potential of the anode 103 and of the beam guiding tube 104. The optical axis OA of the SEM 100 extends through the respective passage openings.

The second detector 117 serves to detect those electrons which emerge from the object 114 under a relatively large solid angle. These are primarily secondary electrons. By contrast, only a relatively small portion of electrons scattered back at the object 114—i.e. backscattered electrons—which have a relatively high kinetic energy compared to the secondary electrons when emerging from the object 114 are detected by the second detector 117 since the backscattered electrons, as seen in the direction of the optical axis OA, are focused by the first objective lens 107 to the optical axis OA relatively close to the second detector 117 and they are therefore able to pass through the passage opening of the second detector 117. Therefore, the first detector 116 substantially serves to detect the backscattered electrons.

In a further embodiment of the SEM 100, the first detector 116 can be embodied, additionally or alternatively, with a grid electrode (not depicted here). The grid electrode is arranged at the side of the first detector 116 directed toward the object 114. In respect of the potential of the beam guiding tube 104, the grid electrode has such a negative potential that only backscattered electrons with a high energy are able to pass through the grid electrode to the first detector 116. Additionally or alternatively, the second detector 117 has a grid electrode, which has an analogous embodiment to the aforementioned grid electrode of the first detector 116 and which has an analogous function.

The detection signals generated by the first detector 116 and the second detector 117 are used to generate an image or images of the surface of the object 114. Reference is explicitly made to the fact that the apertures of the first aperture unit 108 and of the second aperture unit 109, as well as the passage openings of the first detector 116 and of the second detector 117 are depicted in exaggerated fashion. The passage openings of the first detector 116 and of the second detector 117 have a longitudinal extent in the range from 0.5 mm to 5 mm, as seen perpendicular to the optical axis OA. By way of example, they have a circular embodiment and a diameter in the region of 1 mm to 3 mm.

The second aperture unit 109 is configured as a pinhole aperture in the exemplary embodiment depicted here and it is provided with a second aperture 118 for the passage of the primary electron beam, which has an extent in the range from 5 μm to 500 μm, e.g. 35 μm, perpendicular to the optical axis OA. In a further exemplary embodiment, the second aperture unit 109 can also be embodied with a plurality of second apertures 118, which can be displaced mechanically to the primary electron beam or which can be obtained by the primary electron beam by using electrical and/or magnetic deflection elements. The second aperture unit 109 is embodied as a pressure stage aperture. It separates a first region, in which the electron source 101 is arranged and in which an ultra-high vacuum ($10^{-6}$ Pa to $10^{-10}$ Pa) prevails, from a second region, which has a high vacuum ($10^{-1}$ Pa to $10^{-5}$ Pa). The second region is the intermediate pressure region of the beam guiding tube 104, which leads to the sample chamber 120.

In addition to image generation, further examination methods can be carried out using the SEM 100. These include the so-called EBSD ("electron backscattered diffraction") method, in which diffraction patterns of scattered electrons are established. A further examination method is based on the detection of cathodoluminescence light, which emerges from the object 114 when the primary electron beam is incident on the object 114. Further examination methods include, for example, the examination by means of energy-dispersive x-ray spectroscopy (EDX) and the examination by means of wavelength-dispersive x-ray spectroscopy (WDX). For these further examination methods, provision is made of at least a third detector 119, which is arranged in the region of the sample chamber 120, for example between the beam guiding tube 104 and the object 114 laterally from the object 114. The third detector 119 can also be an Everhart-Thornley detector, which is usually arranged in the sample chamber 120 in the SEM 100. The SEM 100 furthermore has a fourth detector 121, which is arranged in the sample chamber 120. More precisely, the fourth detector 121 is arranged behind the object 114, as seen from the electron source 101 along the optical axis OA. The primary electron beam passes through the object 114 to be examined. When the primary electron beam passes through the object 114 to be examined, the electrons of the primary electron beam interact with the material of the object 114 to be examined. The electrons passing through the object 114 to be examined are detected by the fourth detector 121.

Figure 3:
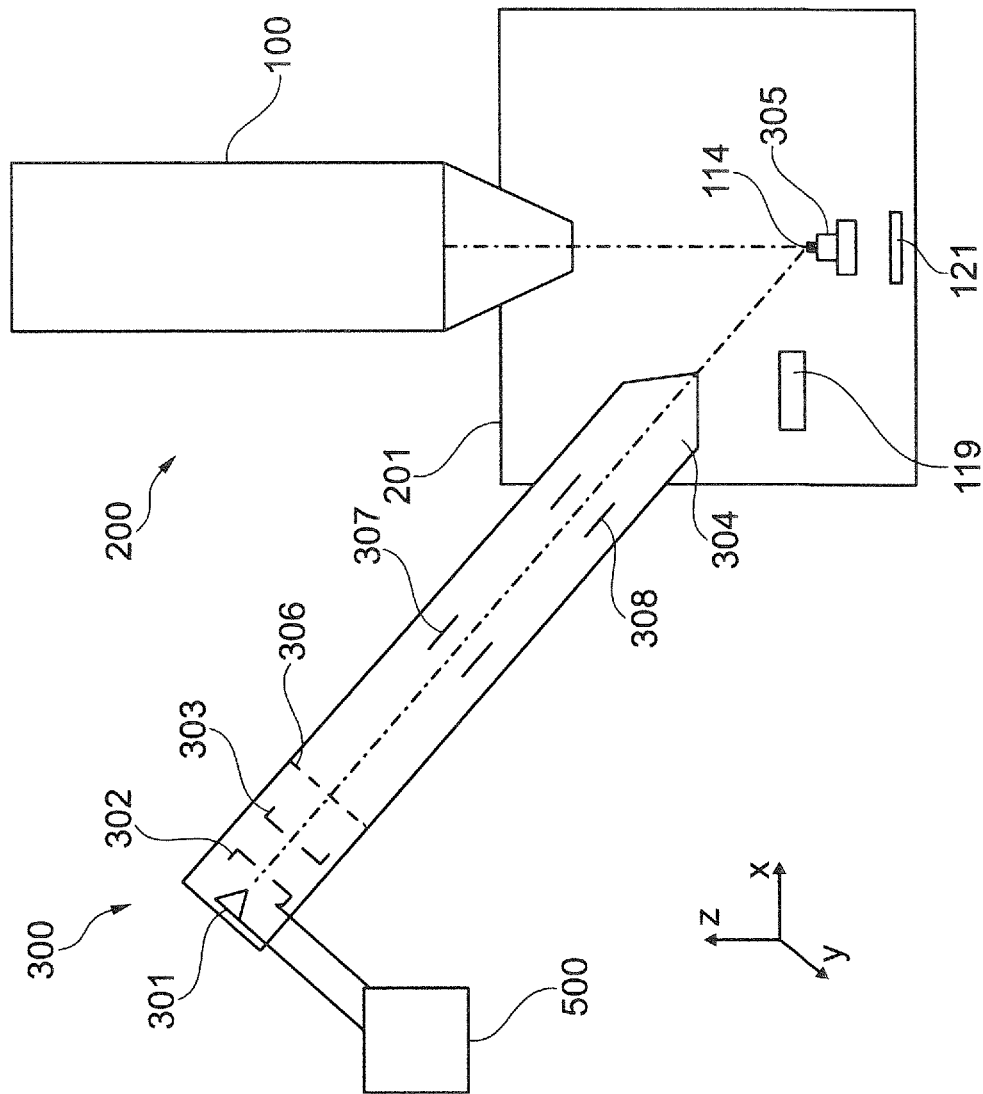
FIG. 3 shows a schematic illustration of a combination apparatus with an electron beam apparatus and an ion beam apparatus according to the system described herein.

FIG. 3 shows a particle beam apparatus in the form of a combination apparatus 200. The combination apparatus 200 has two particle beam columns. Firstly, the combination apparatus 200 is provided with the SEM 100, as already depicted in FIG. 2, but without the sample chamber 120. Rather, the SEM 100 is arranged at a sample chamber 201. The SEM 100 serves to generate a first particle beam, namely the primary electron beam already described further above. Secondly, the combination apparatus 200 is provided with an ion beam apparatus 300, which is likewise arranged at the sample chamber 201.

The SEM 100 is arranged vertically in relation to the sample chamber 201. By contrast, the ion beam apparatus 300 is arranged inclined by an angle of approximately 50° in relation to the SEM 100. It has a second beam generator in the form of an ion beam generator 301. Ions, which form a second particle beam in the form of an ion beam, are generated by the ion beam generator 301. The ions are accelerated by means of an extraction electrode 302, which is at a predeterminable potential. The second particle beam then reaches through ion optics of the ion beam apparatus 300, wherein the ion optics comprise a condenser lens 303 and a second objective lens 304. The second objective lens 304 ultimately generates an ion probe, which is focused on the object 114 arranged on a sample holder 305.

An adjustable aperture 306, a first electrode arrangement 307 and a second electrode arrangement 308 are arranged above the objective lens 304 (i.e. in the direction of the ion beam generator 301), wherein the first electrode arrangement 307 and the second electrode arrangement 308 are embodied as scanning electrodes. The second particle beam is scanned over the surface of the object 114 by means of the first electrode arrangement 307 and the second electrode arrangement 308, wherein the first electrode arrangement 307 acts in a first direction and the second electrode arrangement 308 acts in a second direction, which is counter to the first direction. Using this, there is a scanning in e.g. the x-direction. The scanning in a y-direction perpendicular thereto is brought about by further electrodes (not depicted here), which are rotated by 90°, at the first electrode arrangement 307 and at the second electrode arrangement 308.

The distances depicted in FIG. 3 between the individual units of the combination device 200 are depicted in exaggerated fashion in order to better depict the individual units of the combination device 200.

Figure 4:
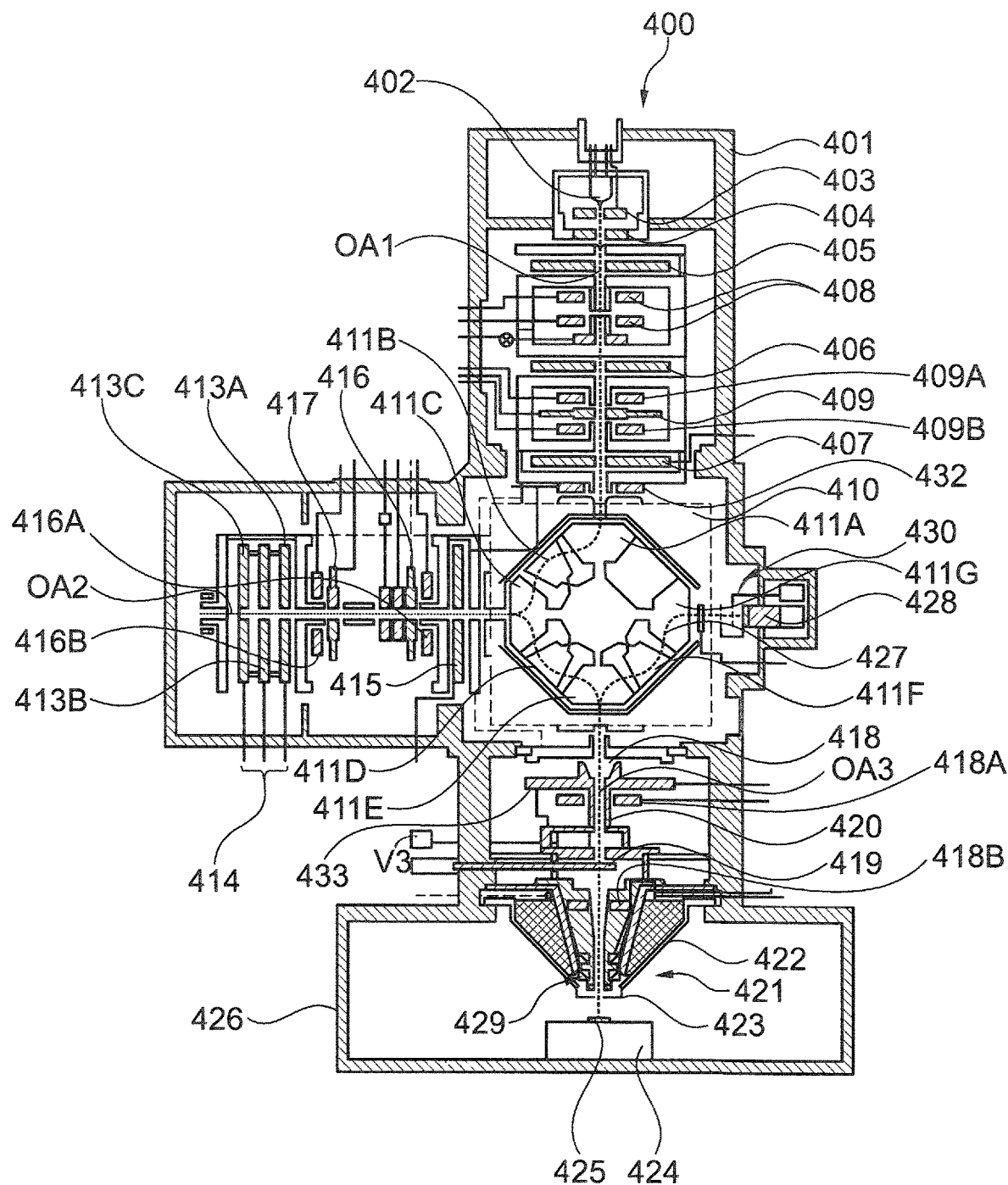
FIG. 4 shows a schematic illustration of a further particle beam apparatus with a system for correcting chromatic aberration and spherical aberration according to the system described herein.

FIG. 4 is a schematic illustration of a further exemplary embodiment of a particle beam apparatus according to the system described herein. This exemplary embodiment of the particle beam apparatus is provided with the reference sign 400 and comprises a mirror corrector for correcting e.g. chromatic and spherical aberrations. The particle beam apparatus 400 comprises a particle beam column 401, which is embodied as an electron beam column and substantially corresponds to an electron beam column of a corrected SEM. However, the particle beam apparatus 400 is not restricted to an SEM with a mirror corrector. Rather, the particle beam apparatus can comprise any type of correction units.

The particle beam column 401 comprises a particle beam generator in the form of an electron source 402 (cathode), an extraction electrode 403, and an anode 404. By way of example, the electron source 402 is embodied as a thermal field emitter. Electrons emerging from the electron source 402 are accelerated to the anode 404 due to a potential difference between the electron source 402 and the anode 404. Accordingly, a particle beam in the form of an electron beam is formed along a first optical axis OA1.

The particle beam is guided along a beam path, which corresponds to the first optical axis OA1, after the particle beam has emerged from the electron source 402.

A first electrostatic lens 405, a second electrostatic lens 406, and a third electrostatic lens 407 are used to guide the particle beam.

Furthermore, the particle beam is adjusted along the beam path using a beam guiding device. The beam guiding device of this exemplary embodiment comprises a source adjustment unit with two magnetic deflection units 408 arranged along the first optical axis OA1. Moreover, the particle beam apparatus 400 comprises electrostatic beam deflection units. A first electrostatic beam deflection unit 409, which is embodied as a quadrupole in one embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A, and the second multi-pole unit 409B are adjusted for the purposes of adjusting the particle beam in respect of the axis of the third electrostatic lens 407 and the entrance window of a beam deflection device 410. The first electrostatic beam deflection unit 409, the first multi-pole unit 409A and the second multi-pole unit 409B can interact like a Wien filter. A further magnetic deflection element 432 is arranged at the entrance of the beam deflection device 410.

The beam deflection device 410 is used as a particle beam deflector, which deflects the particle beam in a specific manner. The beam deflection device 410 comprises a plurality of magnetic sectors, namely a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and it is deflected by the beam deflection device 410 in the direction of the second optical axis OA2. The beam deflection is carried out by means of the first magnetic sector 411A, by means of the second magnetic sector 411B, and by means of the third magnetic sector 411C. The second optical axis OA2 can be aligned at an angle of 30° to 120° with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the exemplary embodiment in FIG. 4, the deflection from the second optical axis OA2 to the third optical axis OA3 is provided by deflecting the particle beam through an angle of 90°. Hence, the third optical axis OA3 extends coaxially with respect to the first optical axis OA1. However, reference is made to the fact that the particle beam apparatus 400 according to the system described herein described here is not restricted to deflection angles of 90°. Rather, any suitable deflection angle can be selected by the beam deflection device 410, for example 70° or 110°, such that the first optical axis OA1 does not extend coaxially with respect to the third optical axis OA3. In respect of further details of the beam deflection device 410, reference is made to EP 1 388 882 A2.

After the particle beam was deflected by the first magnetic sector 411A, the second magnetic sector 411B, and the third magnetic sector 411C, the particle beam is guided along the second optical axis OA2. The particle beam is guided to an electrostatic mirror 414 and it extends along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit on the path to the electrostatic mirror 414. The electrostatic mirror 414 comprises a first mirror electrode 413A, a second mirror electrode 413B, and a third mirror electrode 413C. Electrons of the particle beam which are reflected back at the electrostatic mirror 414 once again extend along the second optical axis OA2 and re-enter the beam deflection device 410. Then, they are deflected to the third optical axis OA3 by the third magnetic sector 411C, the fourth magnetic sector 411D, and the fifth magnetic sector 411E.

The electrons of the particle beam emerge from the beam deflection device 410 and are guided along the third optical axis OA3 to the object 425 which is intended to be examined. On the path to the object 425, the particle beam is guided to a fifth electrostatic lens 418, a lower beam guiding tube 420, a fifth multi-pole unit 418A, a sixth multi-pole unit 418B, and an objective lens 421. The fifth electrostatic lens 418 is an electrostatic immersion lens. By way of the fifth electrostatic lens 418, the particle beam is decelerated or accelerated to an electric potential of the lower beam guiding tube 420.

By means of the objective lens 421, the particle beam is focused in a focal plane in which the object 425 is arranged. The object 425 is arranged on a movable sample stage 424. The movable sample stage 424 is arranged in a sample chamber 426 of the particle beam apparatus 400.

The objective lens 421 can be embodied as a combination of a magnetic lens 422 and a sixth electrostatic lens 423. The end of the lower beam guiding tube 420 furthermore can be an electrode of an electrostatic lens. After emerging from the lower beam guiding tube 420, particles of the particle beam apparatus 400 are decelerated to a potential of the object 425 arranged on the sample stage 424. The objective lens 421 is not restricted to a combination of the magnetic lens 422 and the sixth electrostatic lens 423. Rather, the objective lens 421 can assume any suitable form. By way of example, the objective lens also can be embodied as a purely magnetic lens or only as a purely electrostatic lens.

The particle beam which is focused onto the object 425 interacts with the object 425. Interaction particles are generated. In particular, secondary electrons are emitted from the object 425 or backscattered electrons are scattered back at the object 425. The secondary electrons and/or the backscattered electrons are accelerated again and guided into the lower beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 comprises a first detector 419 which is arranged between the beam deflection device 410 and the objective lens 421 along the beam path. Secondary electrons traveling in directions aligned at a large angle in respect of the third optical axis OA3 are detected by the first detector 419. Backscattered electrons and secondary electrons which have a small spacing from the axis in respect of the third optical axis OA3 at the position of the first detector 419—i.e. backscattered electrons and secondary electrons which have a small distance from the third optical axis OA3 at the position of the first detector 419—enter into the beam deflection device 410 and are deflected to a second detector 428 by the fifth magnetic sector 411E, the sixth magnetic sector 411F, and the seventh magnetic sector 411G along a detection beam path 427. By way of example, the deflection angle is 90° or 110°. The second detector 428 generates detection signals on the basis of the detected backscattered electrons and/or secondary electrons.

The first detector 419 generates detection signals which are largely generated by emitted secondary electrons. The detection signals which are generated by the first detector 419 and the second detector 428 are guided to an electronics unit (not depicted here) and used to obtain information about the properties of the interaction region of the focused particle beam with the object 425. In particular, the focused particle beam is scanned over the object 425 using a scanning device 429. Then, an image of the scanned region of the object 425 can be generated by the detection signals, which are generated by the first detector 419 and the second detector 428, and it can be displayed on a display unit, for example a monitor.

A filter electrode 430 can be arranged upstream of the second detector 428. By way of example, the filter electrode 430 is used to separate secondary electrons from the backscattered electrons due to the difference in the kinetic energy thereof.

FIG. 5 once again shows the particle beam apparatus 400 in accordance with FIG. 4. The same components are provided with the same reference sign. For the purposes of a better overview, several reference signs were omitted in FIG. 5 in comparison with FIG. 4. The anode 404 is linked to an upper beam guiding tube 431. Accordingly, together with the anode 404, the upper beam guiding tube 431 is at the same potential, for example the anode potential. The upper beam guiding tube 431 extends from the anode 404 to the fifth electrostatic lens 418. The electrostatic field of the fifth electrostatic lens 418 is determined by the potential of the anode 404, at which the electrode in the form of the upper beam guiding tube 431 is, and by the potential at which an electrode 433, which is electrically linked to the lower beam guiding tube 420, is (cf. FIG. 4). A further beam guiding tube 431A is arranged in the region of the electrostatic mirror 414. The further beam guiding tube 431A and an inner housing of the beam deflection device 410 are electrically linked to the upper beam guiding tube 431 and at the same potential as the upper beam guiding tube 431.

High-voltage components of the particle beam apparatuses 100, 200, and 400 depicted in FIGS. 2 to 5 are at a high voltage, which is provided by at least one high-voltage supply unit. By way of example, the electron source 101 is linked to a high-voltage supply unit 500. Furthermore, the extraction electrode 102 is linked to a high-voltage supply unit 500' and the anode 103 of the SEM 100 is linked to a high-voltage supply unit 500" (cf. FIG. 2). In the combination apparatus 200, e.g. the ion beam generator 301 and the extraction electrode 302 in the ion beam apparatus 300 are connected to a high-voltage supply unit 500. Moreover, further lenses of the ion beam apparatus 300, for example the condenser lens 303 and/or the second objective lens 304, can be designed as electrostatic lenses, which are likewise linked to a high-voltage supply unit and supplied by this high-voltage supply unit. By way of example, this high-voltage supply unit is the high-voltage supply unit 500. The invention is not restricted to the aforementioned high-voltage components. Rather, each further high-voltage component of the aforementioned particle beam apparatuses can be electrically linked to the high-voltage supply unit 500 or a further high-voltage supply unit.

Figure 5:
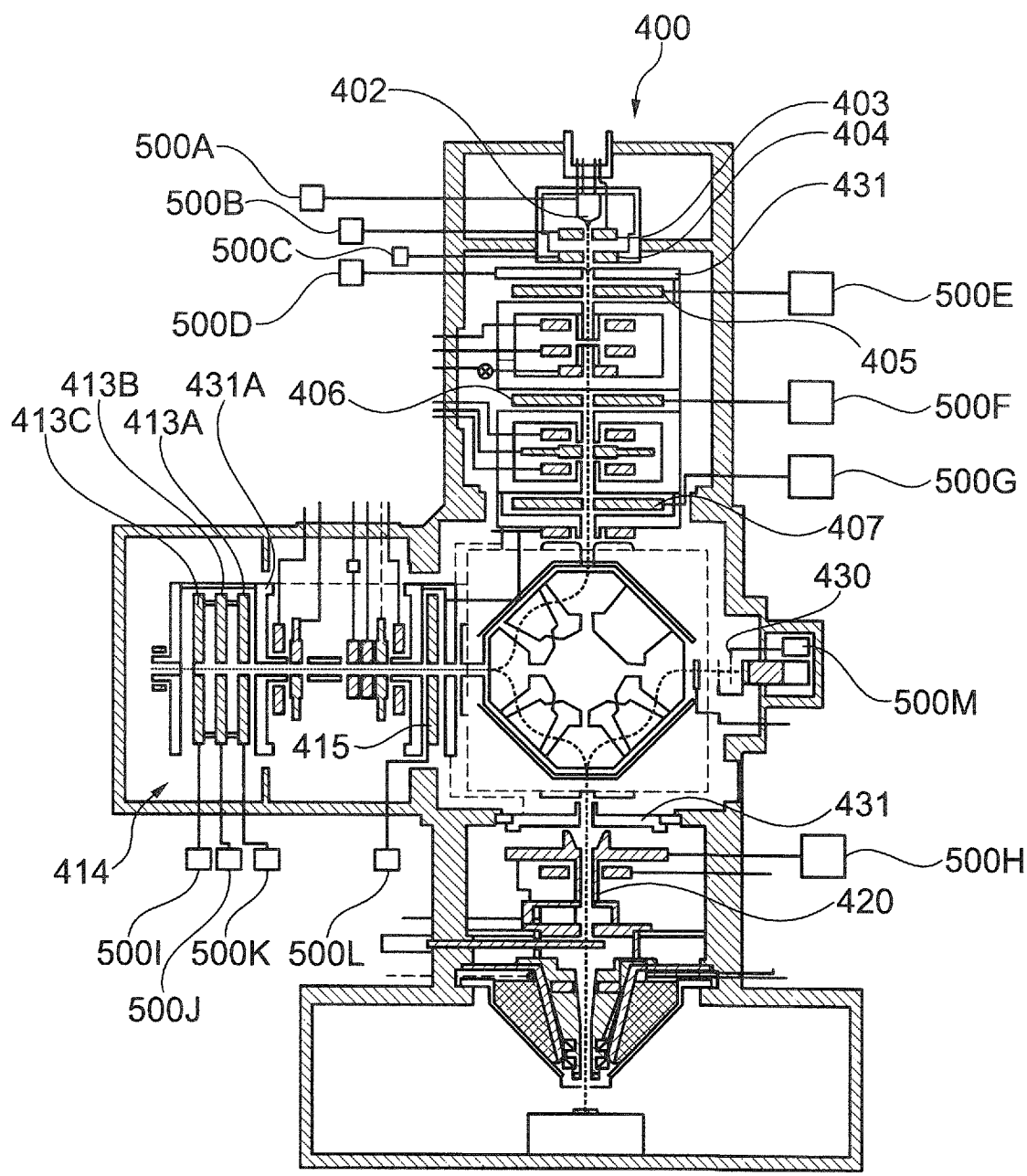
FIG. 5 shows a further schematic illustration of the particle beam apparatus in accordance with FIG. 4.

In the exemplary embodiment of the particle beam apparatus 400 according to the system described herein, depicted in FIGS. 4 and 5, at least one of the high-voltage components of the particle beam apparatus 400 specified below can be at a high voltage and be actuated and supplied by a high-voltage supply unit: the electron source 402, the extraction electrode 403, the anode 404, the first electrostatic lens 405, the second electrostatic lens 406, the third electrostatic lens 407, the first mirror electrode 413A, the second mirror electrode 413B, the third mirror electrode 413C, the fourth electrostatic lens 415, the lower beam guiding tube 420, and the filter electrode 430. By way of example, the electron source 402 is electrically linked to a first high-voltage supply unit 500A. Furthermore, for example, the extraction electrode 403 is electrically linked to a second high-voltage supply unit 500B. Moreover, the anode 404 is electrically linked to a third high-voltage supply unit 500C. By way of example, the upper beam guiding tube 431 can be electrically linked to a fourth high-voltage supply unit 500D. However, it is also possible for the anode 404 to be electrically linked to the upper beam guiding tube 431, as was already described further above. In this case, the potential of the upper beam guiding tube 431 is supplied by the third high-voltage supply unit 500C via the anode 404. Then, the fourth high-voltage supply unit 500D is not required. The first electrostatic lens 405 is electrically linked to a fifth high-voltage supply unit 500E. Furthermore, the second electrostatic lens 406 is electrically linked to a sixth high-voltage supply unit 500F. Moreover, the third electrostatic lens 407 is electrically linked to a seventh high-voltage supply unit 500G. The lower beam guiding tube 420 is electrically linked to an eighth high-voltage supply unit 500H. Furthermore, the third mirror electrode 413C is electrically linked to a ninth high-voltage supply unit 500I. Moreover, the second mirror electrode 413B is electrically linked to a tenth high-voltage supply unit 500J. Furthermore, the first mirror electrode 413A is electrically linked to an eleventh high-voltage supply unit 500K. The fourth electrostatic lens 415 is electrically linked to a twelfth high-voltage supply unit 500L. In a further embodiment, provision is made for the filter electrode 430 to be electrically linked to a thirteenth high-voltage supply unit 500M.

Figure 6:
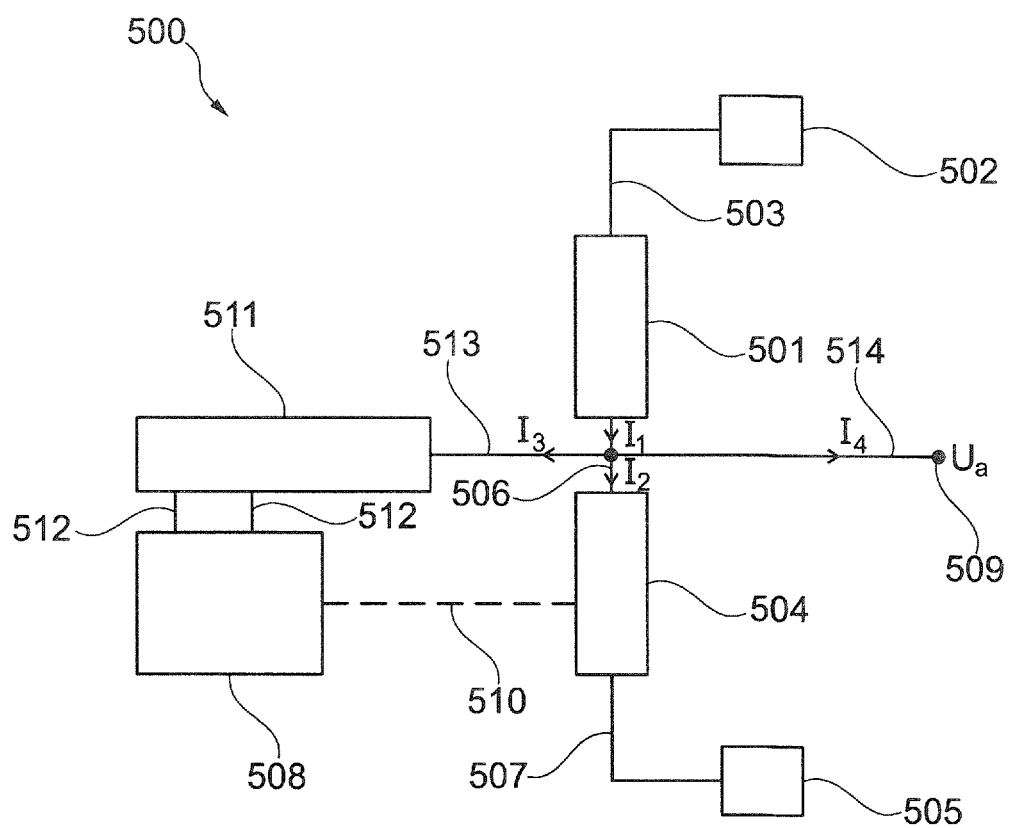
FIG. 6 shows a schematic block diagram of a high-voltage supply unit according to the system described herein.

The first to thirteenth high-voltage supply units 500A to 500M can have an identical embodiment. By way of example, they are embodied like the high-voltage supply unit 500 which is explained in more detail below. FIG. 6 is discussed first.

In a schematic block diagram, FIG. 6 shows a circuit arrangement by means of which the high-voltage supply unit 500 is constituted. The high-voltage supply unit 500 has a first current source 501 for providing a first current $I_1$. By way of example, the first current source 501 can be embodied as a constant current source such that the first current $I_1$ provided by the first current source 501 is constant. Alternatively, provision is made for embodying the first current source 501 as an adjustable current source such that the first current $T_1$ can be adjusted. In the embodiment of the high-voltage supply unit 500 depicted in FIG. 6, the first current source 501 preferably is a constant current source. A first voltage source 502 is connected to the first current source 501 by way of a first line 503. The first voltage source 502 provides an operating voltage for the first current source 501.

The high-voltage supply unit 500 furthermore has a second current source 504 for providing a second current $I_2$. By way of example, the second current source 504 is embodied as an adjustable current source such that the second current $I_2$ provided by the second current source 504 is adjustable. Alternatively, provision is made for embodying the second current source 504 as a constant current source such that the second current $I_2$ is constant. In the embodiment of the high-voltage supply unit 500 depicted in FIG. 6, the second current source 504 is embodied as an adjustable current source. The second current source 504 is linked to the first current source 501 by way of a second line 506. The first current source 501 is switched in series with the second current source 504. For the purposes of supplying the second current source 504 with an operating voltage, a second voltage source 505 is linked to the second current source 504 by way of a third line 507.

In a further embodiment of the system described herein, provision is made for the first current source 501 and the second current source 504 to be embodied as adjustable current sources.

The high-voltage supply unit 500 moreover has an adjustment and/or control loop 508 for adjusting an output voltage $U_a$. The output voltage $U_a$ is provided and tapped at a high-voltage connector 509. The output voltage $U_a$ is a high voltage which is provided to at least one of the high-voltage components, mentioned further above, of one of the aforementioned particle beam apparatuses 100, 200 or 400. Expressed in other words, the output voltage $U_a$ is applied to at least one of the aforementioned high-voltage components of one of the aforementioned particle beam apparatuses 100, 200 or 400.

The high-voltage supply unit 500 has an optical and/or electronic coupling device 510, which links the adjustment and/or control loop 508 with the adjustable second current source 504. If the first current source 501 is embodied as an adjustable current source, the optical and/or electronic coupling device 510 can additionally or alternatively link the adjustment and/or control loop 508 to the first current source 501. In FIG. 6, the optical and/or electronic coupling device 510 is depicted schematically using dashed lines. By way of example, the optical and/or electronic coupling device 510 is embodied as an optical waveguide. In addition or as an alternative thereto, provision is made for the optical and/or electronic coupling device 510 to have a transmission unit at the adjustment and/or control loop 508 and a reception unit at the adjustable second current source 504. The transmission unit is embodied as e.g. an LED and the reception unit is embodied as e.g. a light receptor. In addition or as an alternative thereto, provision is made of a transmission by means of radio signals between the reception unit and the transmission unit. By way of example, any electronic coupling or transfer which allows separation or isolation of the different high-voltage potentials is usable.

The high-voltage supply unit 500 has a feedback resistor 511. The feedback resistor 511 is linked to the adjustment and/or control loop 508 by way of fourth lines 512. Moreover, the feedback resistor 511 is linked to the first current source 501 by way of a fifth line 513 and by way of parts of the second line 506. The feedback resistor 511 is also connected to the second current source 504, namely by way of the fifth line 513 and parts of the second line 506.

A third current $I_3$, which flows through the fifth line 513, flows through the feedback resistor 511. Furthermore, the feedback resistor 511, the first current source 501, and the second current source 504 are linked to the high-voltage connector 509 by way of a seventh line 514, through which a fourth current $I_4$ flows. In the case of an electrostatic application, the fourth current $I_4$ can also have an absolute value of zero.

In a further embodiment, provision is made not only of the feedback resistor 511, but provision is additionally made of at least one further feedback resistor (not depicted here) which is switched parallel with the feedback resistor 511. By way of example, the further feedback resistor can be embodied like the feedback resistor 511, which will still be explained in more detail below. The further feedback resistor serves to reduce the noise.

Figure 7:
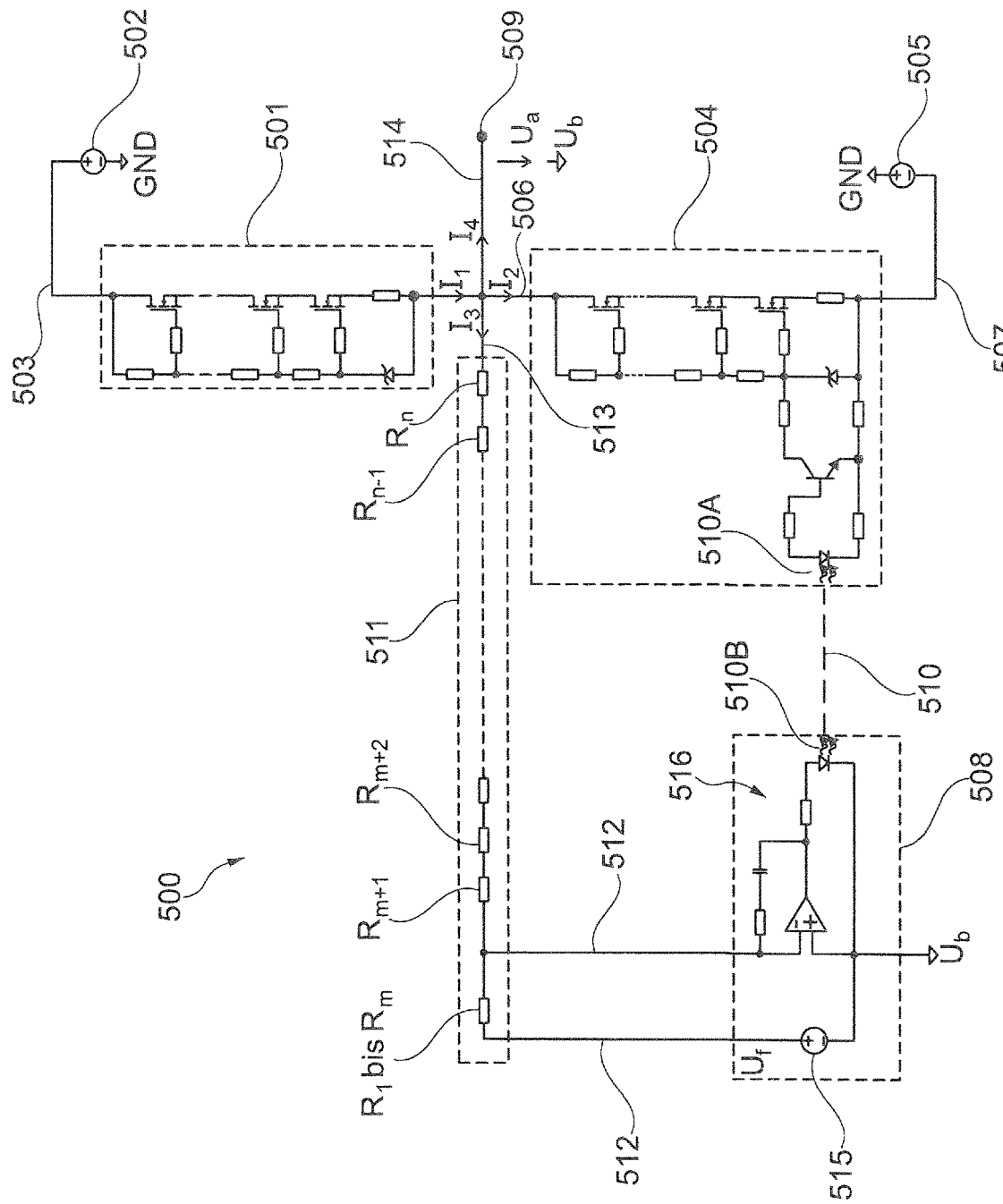
FIG. 7 shows a schematic block diagram of an embodiment of the high-voltage supply unit according to the system described herein.

The components of the high-voltage supply unit 500, i.e. the first current source 501, the first voltage source 502, the second current source 504, the second voltage source 505, the adjustment and/or control loop 508, and/or the feedback resistor 511, can assume any suitable embodiment. An exemplary embodiment as to how the components of the high-voltage supply unit 500 are embodied is depicted in FIG. 7. FIG. 7 is based on FIG. 6. The same components are provided with the same reference sign. The first current source 501 is formed by a cascade connection of bipolar transistors, in particular insulated-gate bipolar transistors (so-called IGBTs), or of metal-oxide-semiconductor field-effect transistors (so-called MOSFETs). An analogous statement applies to the second current source 504, which moreover also has the reception unit 510A of the optical and/or electronic coupling device 510.

The adjustment and/or control loop 508 has a voltage setpoint predetermination unit 515 for predetermining a voltage $U_f$ and a closed-loop control unit 516. Moreover, the adjustment and/or control loop 508 has the transmission unit 510B of the optical and/or electronic coupling device 510.

The feedback resistor 511 is embodied as a resistance sequence. In the exemplary embodiment depicted in FIG. 7, the feedback resistor 511 has n resistors, which are denoted by $R_1$ to $R_n$. The n resistors are switched in series. By way of example, n is an integer in the range from 2 to 800, for example in the range from 200 to 600 or, for example, in the range from 300 to 500. By way of example, n is 400 in one exemplary embodiment. In particular, provision is made for the n resistors to have an identical embodiment and have an identical resistance in each case.

If the second current source 504 is adjustable, the first current source 501 of the high-voltage supply unit 500 serves to predetermine a maximum positive current, namely the first current $I_1$. The adjustable second current source 504 ensures the 4-quadrant operation of the high-voltage supply unit 500. The output voltage $U_a$ is adjusted as outlined below. The voltage drop over the feedback resistor 511 is measured in order to determine the third current $I_3$ therefrom. Then, the second current $I_2$ is adjusted and regulated by means of the adjustment and/or control loop 508 in such a way that the following applies:

$$I_2 = I_1 - I_3 - I_4.$$

Accordingly, the third current $I_3$ is measured in order to adjust the second current $I_2$. The third current $I_3$ is also readjusted by adjusting the second current $I_2$. Then, the output voltage $U_a$ is adjusted in relation to a reference potential $U_b$ in accordance with a divider ratio of the resistance sequence in accordance with the following equation:

$$U_a = U_f \cdot \left( -\frac{(R_{m+1} + R_{m+2} + \cdots + R_n)}{R_1 + R_2 + \cdots + R_m} \right) = -U_f \cdot \left( \frac{n-m}{m} \right)$$

where $U_a$ is the output voltage, $U_f$ is the aforementioned predetermined voltage, $R_1$ to $R_m$ are the values of the first resistors which are switched in series and depicted as a single resistor in FIG. 7, and $R_{m+1}$ to $R_n$ are the values of the further resistors in the resistance sequence.

If the first current source 501 is embodied as an adjustable current source and if the second current source 504 is embodied as a constant current source, then the second current source 504 predetermines a maximum negative current $I_2$. The output voltage $U_a$ then is adjusted in a manner analogous to the explanations above, with the adjustable first current source 501 assuming the function of the aforementioned adjustable second current source 504.

In a further exemplary embodiment, provision is made for the first current source 501 and the second current source 504 to be embodied as adjustable current sources. Then, it is possible to adjust the maximum positive current and the maximum negative current as desired.

The reference potential $U_b$ of the adjustment and/or control loop 508 can assume any potential. In particular, provision is made for the reference potential $U_b$ of the adjustment and/or control loop 508 to be an output voltage of a further high-voltage supply unit, which can have an identical or similar embodiment to the high-voltage supply unit 500. Accordingly, one embodiment of the system described herein provides for the formation of a series connection of high-voltage supply units 500. In principle, only the third currents $I_3$ into the respective feedback resistors 511, which are subject only to hardly measurable variations in the case of a constant output voltage configuration, emerge for the currents between the various high-voltage supply units 500 if the fourth current $I_4$ (i.e. the load current) in the high-voltage components is negligible—as is conventional for electrostatic units in particle beam apparatuses.

If the first current source 501 is embodied not as a constant current source but as an adjustable current source, the current of the first current source 501 can e.g. likewise be adjusted by the adjustment and/or control loop 508 (not depicted here). This was already explained further above.

Figure 8:
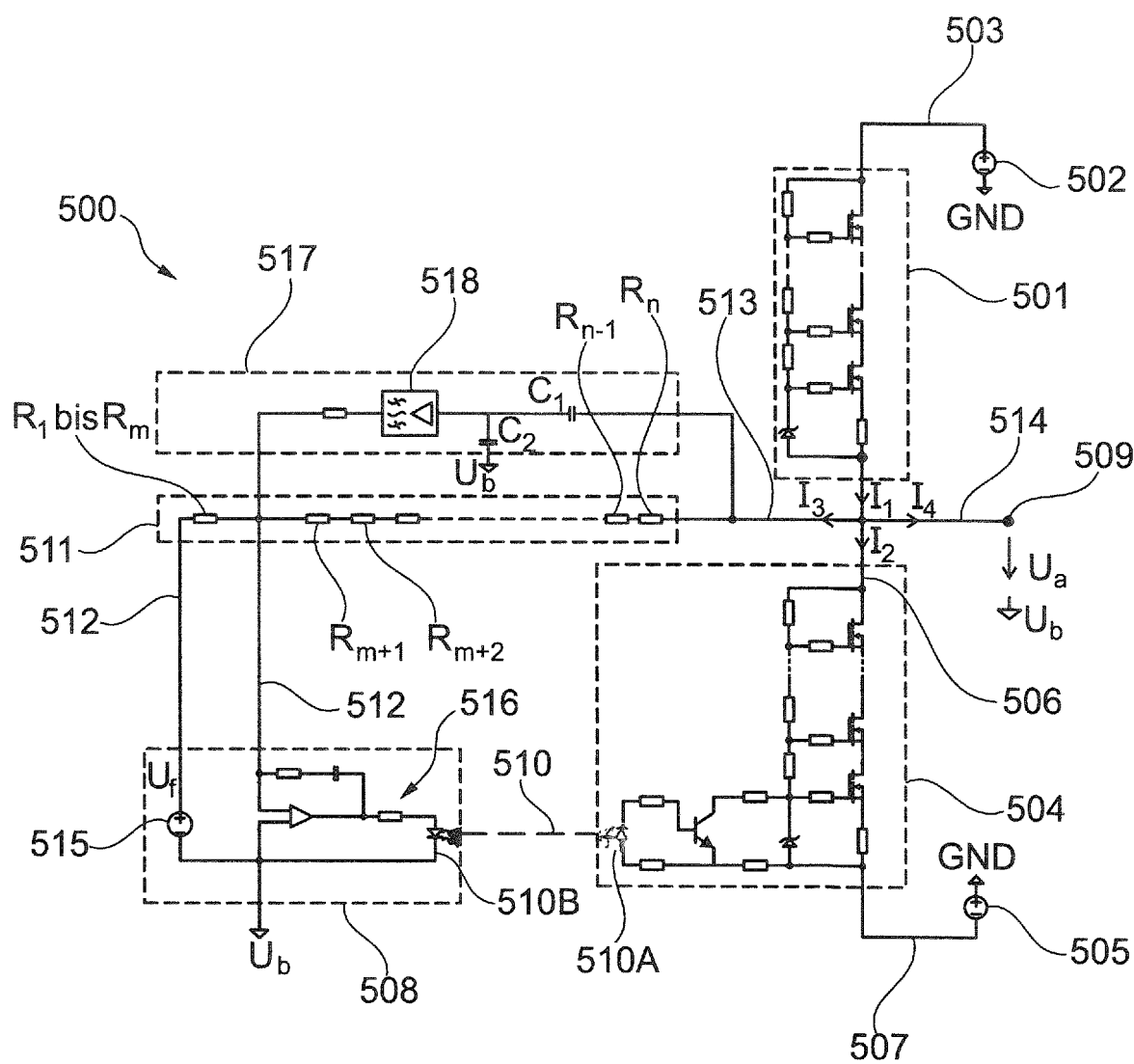
FIG. 8 shows a further embodiment of the high-voltage supply unit according to the system described herein.

FIG. 8 shows a further embodiment of the high-voltage supply unit 500. FIG. 8 is based on FIG. 7. The same components are provided with the same reference sign. In contrast to the embodiment in accordance with FIG. 7, the embodiment of the high-voltage supply unit 500 of FIG. 8 has a feedback unit 517 which is provided with a capacitive voltage divider. Here, the capacitive voltage divider has a first capacitor C1 and a second capacitor C2. Furthermore, the feedback unit 517 has an amplifier and filter unit 518. The feedback unit 517 is switched in parallel with the feedback resistor 511. As a result of this, it is possible to measure a change in the output voltage $U_a$ more quickly and therefore determine the third current $I_3$ flowing through the feedback resistor 511 more quickly. It is then possible to adjust and/or regulate the second current $I_2$ of the adjustable second current source 504 more quickly by means of the adjustment and/or control loop 508. Furthermore, the feedback unit 517 allows a reduction in the residual ripple and the noise due to a higher sensitivity when determining the third current $I_3$. This has already been explained further above. Reference is made to what was explained further above.

Figure 9:
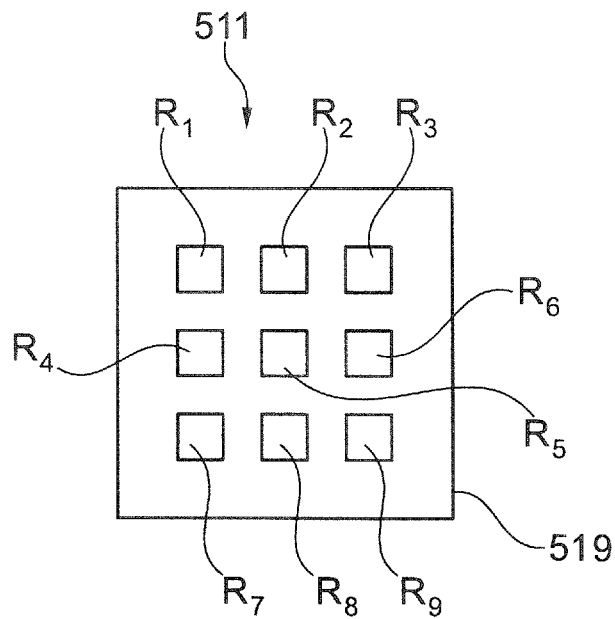
FIG. 9 shows a schematic partial view of an embodiment of a feedback resistor according to the system described herein.
Figure 10:
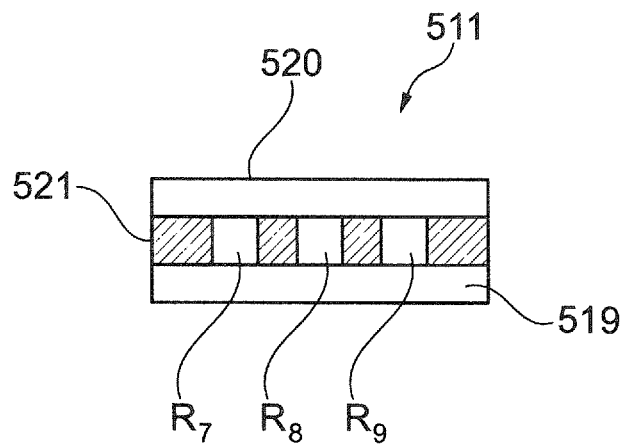
FIG. 10 shows a schematic side view of the feedback resistor in accordance with FIG. 9.
Figure 10A:
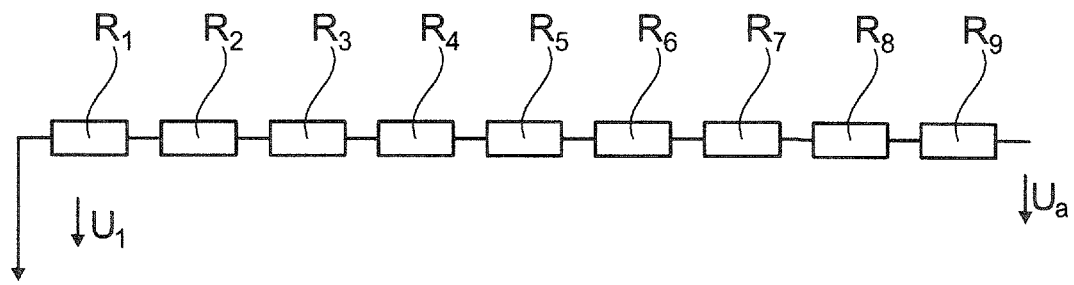
FIG. 10A shows a further view of the feedback resistor in accordance with FIG. 9.

FIGS. 9, 10, and 10A show an exemplary embodiment of the feedback resistor 511 in the form of a resistor circuit arrangement in a schematic illustration. FIG. 9 shows the exemplary embodiment of the feedback resistor 511 in a plan view without a cooling unit. FIG. 10 shows the exemplary embodiment of the feedback resistor 511 in a lateral view with a cooling unit. This is discussed in more detail below.

The feedback resistor 511 in FIG. 9 has a total of 9 resistors $R_1$ to $R_9$. However, the exemplary embodiment is not restricted to this number of resistors. Rather, the feedback resistor 511 can have any suitable number of resistors, for example a number in the range from 2 to 800, for example up to 400. By way of example, the resistors $R_1$ to $R_9$ are arranged on a printed circuit board 519 and switched in series. To this end, use is made of conductor tracks on the printed circuit board 519, which are not depicted here for reasons of clarity. As an alternative thereto, the resistors $R_1$ to $R_9$ can be wired together freely. In the exemplary embodiment using a printed circuit board 519 depicted here, the resistors $R_1$ to $R_9$ are arranged at the same distance from one another and from the printed circuit board 519. Furthermore, the resistors $R_1$ to $R_9$ have an identical embodiment, both in respect of the structural design thereof and in respect of the resistance thereof. The resistors $R_1$ to $R_9$ preferably originate from the same manufacturing batch. Then, the assumption can also be made that the further technical specifications, e.g. the temperature coefficient and the voltage coefficient of the individual resistors, are identical or only differ slightly from one another. The statements already made above in respect of the distribution of the temperature coefficients also apply here.

The feedback resistor 511 is depicted schematically in FIG. 10 in a lateral illustration. The resistors $R_1$ to $R_9$ are surrounded by a thermally conductive insulation 521, which completely fills the space between the resistors $R_1$ to $R_9$. Expressed differently, the thermally conductive insulation 521 completely surrounds the resistors $R_1$ to $R_9$. By way of example, the thermally conductive insulation 521 is embodied as an encapsulation, in particular in the form of a mass made of epoxy resin or polyurethane, or in the form of an insulation liquid. In addition or as an alternative thereto, the thermally conductive insulation 521 can also be made of silicone. The thermally conductive insulation is electrically non-conductive and has a thermal conductivity that is high for an insulation material. In addition to the thermally conductive insulation 521, the feedback resistor 511 has a cooling unit 520. By way of example, water flows through the cooling unit 520 and the latter is configured in such a way that it has a substantially constant temperature substantially at the entire surface thereof. The cooling unit 520 can be part of a housing not depicted here in any more detail.

The cooling unit 520 rests on the thermally conductive insulation 521 and it is arranged with an identical distance from the resistors $R_1$ to $R_9$. By way of example, this distance lies in the range from 0.2 mm to 1 mm. However, the distance is not restricted to this range. Rather, any suitable distance is usable.

The thermally conductive insulation 521 is embodied in such a way that the cooling unit 520 is arranged at the thermally conductive insulation 521. By way of example, the cooling unit 520 lies on the thermally conductive insulation 521. In a further exemplary embodiment, provision is made for the thermally conductive insulation 521 to touch each one of the resistors $R_1$ to $R_9$.

The cooling unit 520 is thermally coupled to the resistors $R_1$ to $R_9$. There is a temperature flow between the resistors $R_1$ to $R_9$ and the cooling unit 520. What is ensured in the embodiment of the feedback resistor 511 shown in FIGS. 9 and 10 is that the resistors $R_1$ to $R_9$ have a substantially identical thermal resistance to the cooling unit 520. Accordingly, as a result of the identical power loss for all resistors $R_1$ to $R_9$, the same temperature difference sets-in between the resistors $R_1$ to $R_9$ and the cooling unit 520. As a result, the mean temperature coefficient of the resistors $R_1$ to $R_9$ together with the temperature changes of the cooling unit 520 or with changes of the power losses of the resistors $R_1$ to $R_9$, which are likewise linked to a common temperature change of the resistors $R_1$ to $R_9$, has the same effect on the resistors $R_1$ to $R_9$ such that the divider ratio $R_1/(R_1+R_2+\ldots+R_9)$ remains constant. It was found that an identical temperature difference in respect of the cooling unit 520 sets-in for all resistors $R_1$ to $R_9$ in the above-described embodiment. Taking this into account, the partial voltage $U_1$ (cf., for example, FIG. 10A) is approximately independent of the temperature difference. This is explained in more detail below. In the described exemplary embodiment of FIGS. 9, 10 and 10A, the following applies for the partial voltage $U_1$:

$$U_1 = U_a \cdot \frac{R_1}{(R_1 + R_2 + R_3 + R_4 + R_5 + R_6 + R_7 + R_8 + R_9)}$$

Since the resistors $R_1$ to $R_9$ have an identical embodiment in the described exemplary embodiment, the assumption can be made that, approximately, the resistors $R_1$ to $R_9$ have a mean temperature coefficient TK. Then, the following applies for the partial voltage $U_1$:

$$U_1 = U_a \cdot \frac{R_1 \cdot (1 + TK \cdot \Delta T)}{(R_1 + R_2 + R_3 + R_4 + R_5 + R_6 + R_7 + R_8 + R_9) \cdot (1 + TK \cdot \Delta T)}$$

It is possible to see that the partial voltage $U_1$ is approximately independent of the temperature difference $\Delta T$ in respect of the cooling unit 520 and the power loss in the resistors $R_1$ to $R_9$.

In a further embodiment of the feedback resistor 511, provision is made for the voltage coefficients VK of the resistors $R_1$ to $R_9$ to be substantially identical. As stated above, all resistors $R_1$ to $R_9$ have the same resistance R. Thus, there is a same voltage drop U at each one of the resistors $R_1$ to $R_9$ as a result of the series connection of the resistors $R_1$ to $R_9$. Taking into account that the following applies for the resistance as a function of the applied voltage $$R(U) = R_{0V} + VK \cdot R_{0V} \cdot U$$

where $R_{0V}$ is the resistance at a voltage of U=0V, and that, in the case of identical resistances, the following applies for the divider ratio:

$$\frac{U_1}{U_a} = \frac{R}{n \cdot R} = \frac{1}{9}$$

then the divider voltage $U_1$ of the feedback resistor 511 is independent of the voltage coefficients of the resistors $R_1$ to $R_9$, since the following applies:

$$U_1 = U_a \cdot \frac{R_{0V} \cdot (1 + VK \cdot U)}{(n \cdot R_{0V}) \cdot (1 + VK \cdot U)} = \frac{1}{9}$$

Thus, in principle, the feedback resistor 511 is a voltage divider which exhibits linear behavior up to the maximum voltage of a partial resistor multiplied by the number n of resistors.

Figure 11:
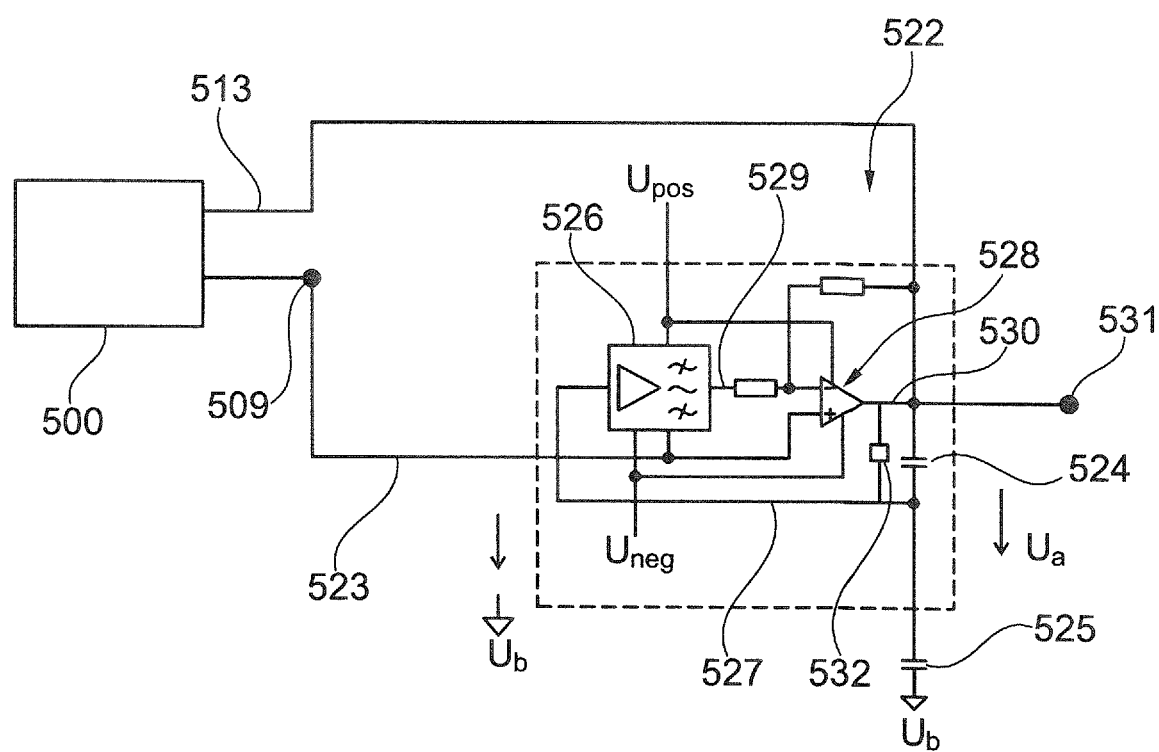
FIG. 11 shows a schematic illustration of a circuit diagram of a high-voltage supply unit with a noise suppression unit according to the system described herein.

FIG. 11 shows a circuit arrangement for generating a high voltage for a particle beam apparatus, for example one of the aforementioned particle beam apparatuses 100, 200 or 400. The circuit arrangement according to the system described herein has a high-voltage supply unit 500, which was already explained further above. The output voltage $U_a$ provided by the high-voltage supply unit 500 is present at the high-voltage connector 509. The circuit arrangement also has a noise suppression unit 522, which is linked to the high-voltage supply unit 500 by way of a link line 523. The output voltage $U_a$ is supplied to the noise suppression unit 522 by means of the link line 523. This is discussed in more detail below. Furthermore, the feedback of the high-voltage supply unit 500, namely the feedback resistor 511 or alternatively the feedback unit 517, is connected to a voltage connector 531 by way of the fifth line 513.

The noise suppression unit 522 comprises a noise measurement device, which has a first capacitor 524, for example a high-voltage capacitor, and a second capacitor 525, for example a high-voltage capacitor. The first capacitor 524 can also have a capacitance of zero such that the divided ratio would then be 1. By way of example, this is realized by virtue of the first capacitor 524 for example having a negligibly small capacitance or the first capacitor 524 for example being removed from the circuit. The line is interrupted at the position of the first capacitor 524 such that two ends of the line lie close opposite one another. Furthermore, the noise suppression unit 522 has an amplifier-filter unit 526 which is linked to the noise measurement device by way of a line 527. Moreover, the noise suppression unit 522 is provided with a noise control loop 528, the noise control loop 528 being linked to the amplifier-filter unit 526 by way of a line 529 and the noise control loop 528 being linked by way of a line 530 to the noise measurement device in the form of the first capacitor 524 and the second capacitor 525. Moreover, the noise suppression unit 522 comprises the voltage connector 531, at which the high voltage is present. The voltage connector 531 is linked to the noise control loop 528 by way of a line. $U_{pos}$ denotes the positive supply voltage and $U_{neg}$ denotes the negative supply voltage for the noise suppression unit 522.

The circuit arrangement in accordance with FIG. 11 improves the noise of the high-voltage supply unit 500 by virtue of the noise control loop 528 being disposed downstream thereof, with the low-noise high voltage being provided at the output, the voltage connector 531 of said noise control loop. The noise suppression is carried out by measuring the AC voltage portion of the high voltage at the voltage connector 531 by way of the noise measurement device in the form of the first capacitor 524, with a resistor 532 switched in series, and the second capacitor 525, and by suppressing the noise using the noise control loop 528. The AC voltage portion of the high voltage measured by the noise measurement device is guided to the amplifier-filter unit 526 as an input signal. The amplifier-filter unit 526 receives the high voltage of the high-voltage supply unit 500 as a further input signal. The output signal of the amplifier-filter unit 526 and the high voltage of the high-voltage supply unit 500 are fed to the noise control loop 528. Then, the output signal of the noise control loop 528 is provided at the voltage connector 531 as low-noise high voltage. The noise suppression acts directly on the high voltage of the high-voltage supply unit 500 and it is, for example, added to the high voltage. The cut-off frequencies of the amplifier-filter unit 526 should differ from the cut-off frequencies of the high-voltage supply unit 500. By way of example, the cut-off frequencies of the amplifier-filter unit 526 and the cut-off frequencies of the high-voltage supply unit 500 differ by a factor of 10. As a result of this, natural oscillations of the circuit arrangement are avoided.

The resistor 532 has two functions. Firstly, it forms a high-pass filter with a defined cut-off frequency together with the parallel capacitance of the capacitor 524, 525. Secondly, it dominates the leakage current in the second capacitor 525, which is embodied e.g. as a high-voltage capacitor with a high voltage drop, in which both internal leakage currents and external creepage currents are not negligible. Then, a DC voltage near 0 V sets-in at the first capacitor 524.

Figure 12:
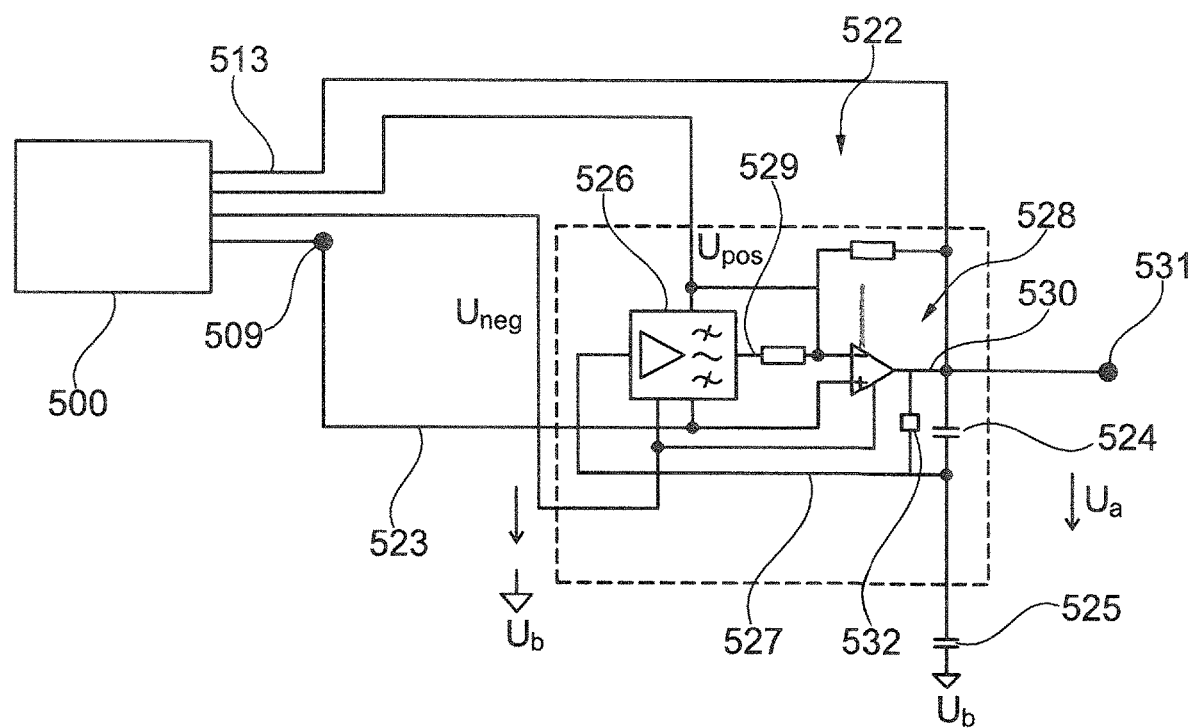
FIG. 12 shows a schematic illustration of a circuit diagram of a further high-voltage supply unit with a noise suppression unit according to the system described herein.

FIG. 12 shows a further circuit arrangement for generating a high voltage for a particle beam apparatus, for example one of the aforementioned particle beam apparatuses 100, 200 or 400. The exemplary embodiment of FIG. 12 is based on the exemplary embodiment of FIG. 11. The same components are therefore denoted by the same reference sign. In contrast to the exemplary embodiment in FIG. 11, provision is made in the exemplary embodiment of FIG. 12 for the positive supply voltage $U_{pos}$ and the negative supply voltage $U_{neg}$ to be provided by the high-voltage supply unit 500. Reference is explicitly made to the fact that the two supply voltages can also be provided in any other suitable way, for example by way of photocells or inductive transmission.

Figure 13:
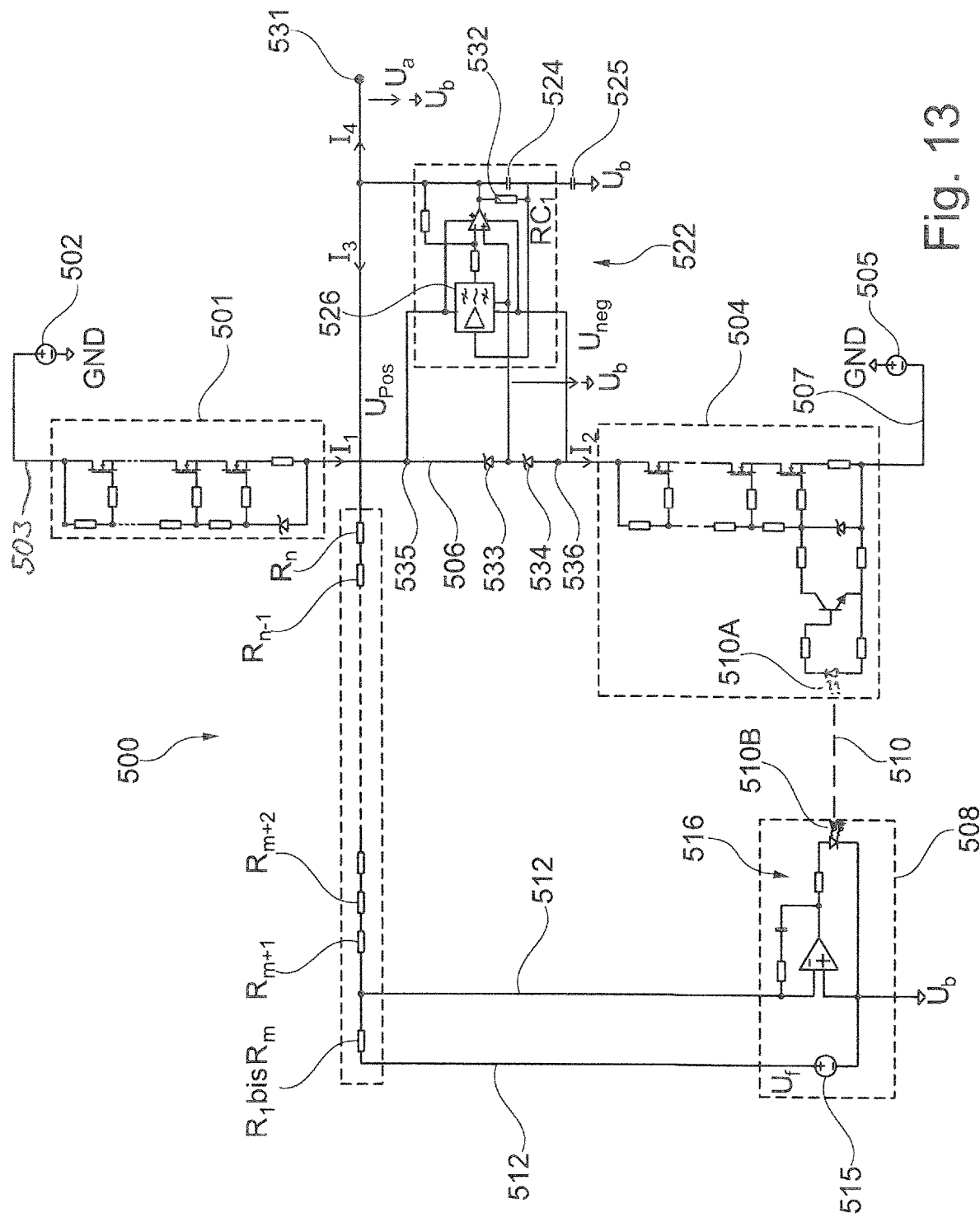
FIG. 13 shows a schematic illustration of a circuit diagram of a yet further high-voltage supply unit with a noise suppression unit according to the system described herein.

FIG. 13 shows a further circuit arrangement for generating a high voltage for a particle beam apparatus, for example one of the aforementioned particle beam apparatuses 100, 200 or 400. The exemplary embodiment of FIG. 13 is based, firstly, on the exemplary embodiment of FIG. 7. Furthermore, the exemplary embodiment of FIG. 13 is based on FIG. 12. The same components are therefore denoted by the same reference sign. FIG. 13 shows a detailed illustration of the tapping of the positive supply voltage $U_{pos}$ and the negative supply voltage $U_{neg}$ at the high-voltage supply unit 500. Thus, both the positive supply voltage $U_{pos}$ and the negative supply voltage $U_{neg}$ are tapped at the second line 506. A first Zener diode 533 and a second Zener diode 534 are switched in series between a first tap 535 for the positive supply voltage $U_{pos}$ and a second tap 536 for the negative supply voltage $U_{neg}$.

The features of the invention disclosed in the present description, in the drawings and in the claims can be essential for the realization of the invention in the various embodiments thereof, both individually and in arbitrary combinations. The invention is not restricted to the described embodiments. It can be varied within the scope of the claims, taking into account the knowledge of the relevant person skilled in the art.

What is claimed is:

1. A circuit arrangement for generating a high voltage for a particle beam apparatus, comprising
at least one high-voltage supply unit for providing an output voltage;
at least one noise suppression unit, which is linked to the high-voltage supply unit by way of at least one link line for guiding the output voltage of the high-voltage supply unit into the noise suppression unit, wherein the noise suppression unit comprises:
at least one noise measurement device for registering noise of the output voltage,
at least one amplifier-filter unit, wherein the amplifier-filter unit is linked to the noise measurement device by way of an eighth line,
at least one control loop, wherein the control loop is linked to the amplifier-filter unit by a ninth line and wherein the control loop is linked to the noise measurement device by a tenth line, and comprises
at least one high-voltage connector, at which the high voltage is present, wherein the high-voltage connector is linked to the control loop by way of an eleventh line.

2. The circuit arrangement as claimed in claim 1, wherein one of the following features is formed at the high-voltage supply unit:
the first current source is embodied as an adjustable current source and the second current source is embodied as a constant current source;
the first current source is embodied as a constant current source and the second current source is embodied as an adjustable current source; or
both the first current source and the second current source are respectively embodied as an adjustable current source.

3. The circuit arrangement as claimed in claim 1, wherein the feedback resistor is embodied as a resistance sequence.

4. The circuit arrangement as claimed in claim 3, wherein
the feedback resistor has n resistors, wherein n is an integer and the n resistors are switched in series,
the feedback resistor has a holder, on which the n resistors are arranged, and wherein
the feedback resistor has a cooling unit, wherein the cooling unit is thermally coupled to the n resistors for a temperature flow between the n resistors and the cooling unit such that a same temperature sets-in between each resistor and the cooling unit.

5. The circuit arrangement as claimed in claim 4, wherein at least one thermally conductive insulation is arranged between the holder and the cooling unit, wherein the thermally conductive insulation is not electrically conductive.

6. The circuit arrangement as claimed in claim 5, wherein the cooling unit is arranged at the thermally conductive insulation in such a way that the cooling unit touches the thermally conductive insulation.

7. The circuit arrangement as claimed in claim 5, wherein the thermally conductive insulation touches each one of the n resistors.

8. The circuit arrangement as claimed in claim 4, wherein each one of the n resistors has an identical embodiment.

9. The circuit arrangement as claimed in claim 1, wherein the high-voltage supply unit has at least one of the following features:

(i) the first current source and the second current source are switched in series; or
(ii) the output voltage is bipolar.

10. The circuit arrangement as claimed in claim 1, wherein the high-voltage supply unit has one of the following features:
the high-voltage supply unit has at least one feedback unit with at least one capacitive voltage divider, wherein the feedback unit is linked to the feedback resistor;
the high-voltage supply unit has at least one feedback unit with at least one capacitive voltage divider, wherein the feedback unit is switched in parallel with the feedback resistor; or
the high-voltage supply unit has at least one feedback unit with at least one capacitive voltage divider, wherein the capacitive voltage divider has a first capacitor and a second capacitor, wherein the second capacitor has a capacitance of zero.

11. The circuit arrangement as claimed in claim 1, wherein the high-voltage supply unit has one of the following features:
the first voltage source and the second voltage source are embodied as different voltage sources; or
the first voltage source and the second voltage source are embodied as a single voltage source.

12. The circuit arrangement as claimed in claim 1, wherein the at least one high-voltage supply unit includes:
at least one current source for providing a first current,
at least one first voltage source connected to the first current source by way of a first line,
at least one second current source for providing a second current, wherein the second current source is linked to the first current source by way of a second line,
at least one second voltage source linked to the second current source by way of a third line,
at least one adjustment and/or control loop for adjusting and/or regulating the output voltage, wherein the adjustment and/or control loop is linked to the first current source and/or the second current source by way of an optical and/or electronic coupling device, and
at least one feedback resistor, through which a third current flows, wherein the feedback resistor is linked to the adjustment and/or control loop by way of a fourth line, the feedback resistor is linked to the first current source by way of a fifth line, the feedback resistor is linked to the second current source by way of a sixth line, and wherein the feedback resistor, the first current source, and the second current source are linked to a high-voltage connector by way of a seventh line, through which a fourth current flows.

13. The circuit arrangement as claimed in claim 1, wherein the noise measurement device comprises a voltage divider.

14. The circuit arrangement as claimed in claim 13, wherein the circuit arrangement has one of the following features:
the voltage divider is embodied as a capacitive voltage divider; or
the voltage divider is embodied as a capacitive voltage divider comprising a first capacitor and a second capacitor, wherein the first capacitor has a capacitance of zero.

15. A particle beam apparatus for analyzing and/or processing an object, comprising
at least one beam generator for generating a particle beam with charged particles,
at least one objective lens for focusing the particle beam onto the object, at least one detector for detecting interaction particles and/or interaction radiation, wherein the interaction particles and/or the interaction radiation arise/arises due to an interaction of the particle beam with the object, and comprising at least one high-voltage component at which a high voltage is present, wherein the particle beam apparatus includes at least one circuit arrangement having at least one high-voltage supply unit for providing an output voltage, and comprising at least one noise suppression unit, which is linked to the high-voltage supply unit by way of at least one link line for guiding the output voltage of the high-voltage supply unit into the noise suppression unit, wherein the noise suppression unit comprises: at least one noise measurement device for registering noise of the output voltage, at least one amplifier-filter unit, wherein the amplifier-filter unit is linked to the noise measurement device by way of an eighth line, at least one control loop, wherein the control loop is linked to the amplifier-filter unit by a ninth line and wherein the control loop is linked to the noise measurement device by a tenth line, and comprises at least one high-voltage connector, at which the high voltage is present, wherein the high-voltage connector is linked to the control loop by way of an eleventh line.

16. The particle beam apparatus as claimed in claim 15, wherein the particle beam apparatus is embodied as an electron beam apparatus and/or ion beam apparatus.

17. The circuit arrangement as claimed in claim 8, wherein the output voltage is given by:

$$U_a = U_f \cdot \left(-\frac{(R_{m+1} + R_{m+2} + \cdots + R_n)}{R_1 + R_2 + \cdots + R_m}\right) = -U_f \cdot \left(\frac{n-m}{m}\right)$$

where m is an integer less than n and $U_f$ is a predetermined voltage.

18. The particle beam apparatus as claimed in claim 15, further comprising:

at least one high-voltage supply unit having at least one current source for providing a first current, at least one first voltage source connected to the first current source by way of a first line, at least one second current source for providing a second current, wherein the second current source is linked to the first current source by way of a second line, at least one second voltage source linked to the second current source by way of a third line, at least one adjustment and/or control loop for adjusting and/or regulating the output voltage, wherein the adjustment and/or control loop is linked to the first current source and/or the second current source by way of an optical and/or electronic coupling device, and comprising at least one feedback resistor, through which a third current flows, wherein the feedback resistor is linked to the adjustment and/or control loop by way of a fourth line, the feedback resistor is linked to the first current source by way of a fifth line, the feedback resistor is linked to the second current source by way of a sixth line, and wherein the feedback resistor, the first current source, and the second current source are linked to a high-voltage connector by way of a seventh line, through which a fourth current flows.

19. The particle beam apparatus as claimed in claim 15, further comprising:

at least one resistor circuit arrangement having n resistors, wherein n is an integer and the n resistors are switched in series, a holder, on which the n resistors are arranged, and comprising a cooling unit, wherein the cooling unit is thermally coupled to the n resistors for a temperature flow between the n resistors such that a same temperature sets-in between each resistor and the cooling unit.

* * * * *

UNITED STATES PATENT AND TRADEMARK OFFICE
CERTIFICATE OF CORRECTION

PATENT NO. : 10,546,717 B2
APPLICATION NO. : 15/924836
DATED : January 28, 2020
INVENTOR(S) : Edgar Fichter et al.

It is certified that error appears in the above-identified patent and that said Letters Patent is hereby corrected as shown below:

In the Specification

Column 5, Line 5: "where is the first current" should be "where $I_1$ is the first current".

Column 18, Line 14: "the first current $T_1$" should be "the first current $I_1$".

Column 19, Line 50: "a voltage $U_f$and a closed-loop control unit" should read "a voltage $U_f$ and a closed-loop control unit".

Column 20, Line 58: "the current of the first current source" should be "the current $I_1$ of the first current source".

In the Claims

Column 25, Claim 2 should read:
2. The circuit arrangement as claimed in claim 1, wherein the at least one high-voltage supply unit includes:
    at least one current source for providing a first current,
    at least one first voltage source connected to the first current source by way of a first line,
    at least one second current source for providing a second current, wherein the second current source is linked to the first current source by way of a second line,
    at least one second voltage source linked to the second current source by way of a third line, at
    least one adjustment and/or control loop for adjusting and/or regulating the output
voltage, wherein the adjustment and/or control loop is linked to the first current source and/or the second current source by way of an optical and/or electronic coupling device, and
    at least one feedback resistor, through which a third current flows, wherein the feedback resistor is linked to the adjustment and/or control loop by way of a fourth line, the feedback resistor is linked to the first current source by way of a fifth line, the feedback resistor is linked to the second current source by way of a sixth line, and wherein the feedback resistor, the first current source, and Signed and Sealed this
Twenty-seventh Day of July, 2021

Drew Hirshfeld
*Performing the Functions and Duties of the
Under Secretary of Commerce for Intellectual Property and
Director of the United States Patent and Trademark Office* the second current source are linked to a high-voltage connector by way of a seventh line, through which a fourth current flows.

Column 25, Claim 3 should read:
3. The circuit arrangement as claimed in claim 2, wherein one of the following features is formed at the high-voltage supply unit:
    the first current source is embodied as an adjustable current source and the second current source is embodied as a constant current source;
    the first current source is embodied as a constant current source and the second current source is embodied as an adjustable current source; or
    both the first current source and the second current source are respectively embodied as an adjustable current source.

Column 25, Claim 4 should read:
4. The circuit arrangement as claimed in claim 2, wherein the feedback resistor is embodied as a resistance sequence.

Column 25, Claim 5 should read:
5. The circuit arrangement as claimed in claim 4, wherein
    the feedback resistor has n resistors, wherein n is an integer and the n resistors are switched n series,
    the feedback resistor has a holder, on which the n resistors are arranged, and wherein
    the feedback resistor has a cooling unit, wherein the cooling unit is thermally coupled to the n resistors for a temperature flow between the n resistors and the cooling unit such that a same temperature sets-in between each resistor and the cooling unit.

Column 25, Claim 6 should read:
6. The circuit arrangement as claimed in claim 5, wherein at least one thermally conductive insulation is arranged between the holder and the cooling unit, wherein the thermally conductive insulation is not electrically conductive.

Column 25, Claim 7 should read:
7. The circuit arrangement as claimed in claim 6, wherein the cooling unit is arranged at the thermally conductive insulation in such a way that the cooling unit touches the thermally conductive insulation.

Column 25, Claim 8 should read:
8. The circuit arrangement as claimed in claim 6, wherein the thermally conductive insulation touches each one of the n resistors.

Column 25, Claim 9 should read:
9. The circuit arrangement as claimed in claim 5, wherein each one of the n resistors has an identical embodiment.

Column 26, Claim 10 should read:
10. The circuit arrangement as claimed in claim 2, wherein the high-voltage supply unit has at least one of the following features:
(i) the first current source and the second current source are switched in series; or
(ii) the output voltage is bipolar.

Column 26, Claim 11 should read:
11. The circuit arrangement as claimed in claim 2, wherein the high-voltage supply unit has one of the following features:
    the high-voltage supply unit has at least one feedback unit with at least one capacitive voltage divider, wherein the feedback unit is linked to the feedback resistor;
    the high-voltage supply unit has at least one feedback unit with at least one capacitive voltage divider, wherein the feedback unit is switched in parallel with the feedback resistor; or
    the high-voltage supply unit has at least one feedback unit with at least one capacitive voltage divider, wherein the capacitive voltage divider has a first capacitor and a second capacitor, wherein the second capacitor has a capacitance of zero.

Column 26, Claim 12 should read:
12. The circuit arrangement as claimed in claim 2, wherein the high-voltage supply unit has one of the following features:
    the first voltage source and the second voltage source are embodied as different voltage sources; or
    the first voltage source and the second voltage source are embodied as a single voltage source.

Column 27, Claim 17 should read:
17. The circuit arrangement as claimed in claim 9, wherein the output voltage is given by:

$$U_a = U_f \cdot \left( - \frac{(R_{m+1} + R_{m+2} + \cdots + R_n)}{R_1 + R_2 + \cdots + R_m} \right) = - U_f \cdot \left( \frac{n-m}{m} \right)$$

where m is an integer less than n and $U_f$ is a predetermined voltage.